(12) United States Patent
Jung et al.

(10) Patent No.: US 10,354,704 B2
(45) Date of Patent: Jul. 16, 2019

(54) SEMICONDUCTOR MEMORY DEVICE AND MEMORY SYSTEM

(71) Applicant: SAMSUNG ELECTRONICS CO., LTD., Suwon-si, Gyeonggi-do (KR)

(72) Inventors: Jae Hun Jung, Hwaseong-si (KR); Hun Dae Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/988,636

(22) Filed: May 24, 2018

(65) Prior Publication Data

US 2019/0180803 A1 Jun. 13, 2019

(30) Foreign Application Priority Data

Dec. 8, 2017 (KR) .......................... 10-2017-0168144

(51) Int. Cl.
*G11C 8/00* (2006.01)
*G11C 7/22* (2006.01)
*G06F 12/02* (2006.01)
*G11C 7/10* (2006.01)

(52) U.S. Cl.
CPC .......... *G11C 7/222* (2013.01); *G06F 12/0207* (2013.01); *G11C 7/109* (2013.01); *G11C 7/1015* (2013.01); *G11C 2207/2272* (2013.01)

(58) Field of Classification Search
CPC ..... G11C 7/22; G11C 11/4076; G11C 7/1045; G11C 11/005; G11C 11/4097; G11C 11/413; G11C 2207/002; G11C 2207/2227; G11C 2207/2245; G11C 7/10; G11C 7/1018; G11C 8/00; G11C 8/12; G11C 7/1072; G11C 7/1051; G11C 7/1066; G11C 7/1078; G11C 7/222; G11C 7/1012
USPC ... 365/189.05, 230.06, 230.08, 233.1, 189.2, 365/230.01, 230.03, 222, 230.02, 365/189.011, 189.02, 189.04, 189.17, 194
See application file for complete search history.

(56) References Cited

U.S. PATENT DOCUMENTS

| 7,516,281 B2 | 4/2009 | LaBerge |
| 7,656,742 B2 | 2/2010 | Kim et al. |
| 8,432,769 B2 | 4/2013 | Moon |
| 8,710,862 B2 | 4/2014 | Ferolito et al. |

(Continued)

FOREIGN PATENT DOCUMENTS

KR 10-1145784 5/2012

*Primary Examiner* — Thong Q Le
(74) *Attorney, Agent, or Firm* — F. Chau & Associates, LLC

(57) ABSTRACT

A semiconductor memory device divides a clock signal to generate a first clock signal and a second clock signal, outputs a chip selection signal as a first chip selection signal in response to the first clock signal, outputs the buffered chip selection signal as a second chip selection signal in response to the second clock signal, outputs the first chip selection signal as a third chip selection signal in response to the second clock signal, outputs a buffered command and address as a first command and address in response to the first clock signal, outputs the buffered command and address as a second command and address in response to the second clock signal, outputs the first chip selection signal as a first selection signal in response to the first clock signal, and outputs the third chip selection signal as a second selection signal in response to the second clock signal.

20 Claims, 16 Drawing Sheets

(56) References Cited

U.S. PATENT DOCUMENTS

| | | | |
|---|---|---|---|
| 2005/0152210 A1* | 7/2005 | Park | G11C 7/1012 365/233.1 |
| 2014/0192563 A1 | 7/2014 | Rajan et al. | |
| 2016/0028395 A1 | 1/2016 | Bains et al. | |
| 2017/0093400 A1 | 3/2017 | Bains et al. | |
| 2017/0110165 A1 | 4/2017 | Kim et al. | |
| 2017/0194962 A1 | 7/2017 | Bains et al. | |

* cited by examiner

FIG. 2

| COM | CSB | CA | | | | | | | CK (M1) | CK (M2) |
|---|---|---|---|---|---|---|---|---|---|---|
| | | CA1 | CA2 | CA3 | CA4 | CA5 | CA6 | CAr | | |
| ACTIVATE | L | L | L | | | | I | I | 1↑ 2↓ | 1↑ 3↓ |
| | X | | | | | | | | | |
| WRITE | L | H | L | H | H | L | II | II | 1↑ 2↓ | 1↑ 3↓ |
| | H | | | | | | | | | |
| NT_WRITE | L | H | L | H | H | L | X | X | 1↑ 2↓ | 1↑ 3↓ |
| | L | | | | | | | | | |
| READ | L | H | L | H | H | H | II | II | 1↑ 2↓ | 1↑ 3↓ |
| | H | | | | | | | | | |
| NT_READ | L | H | L | H | H | H | X | X | 1↑ 2↓ | 1↑ 3↓ |
| | L | | | | | | | | | |
| MODE REGISTER SET | L | H | L | H | L | L | III | III | 1↑ 2↓ | 1↑ 3↓ |
| | H | | | | | | | | | |

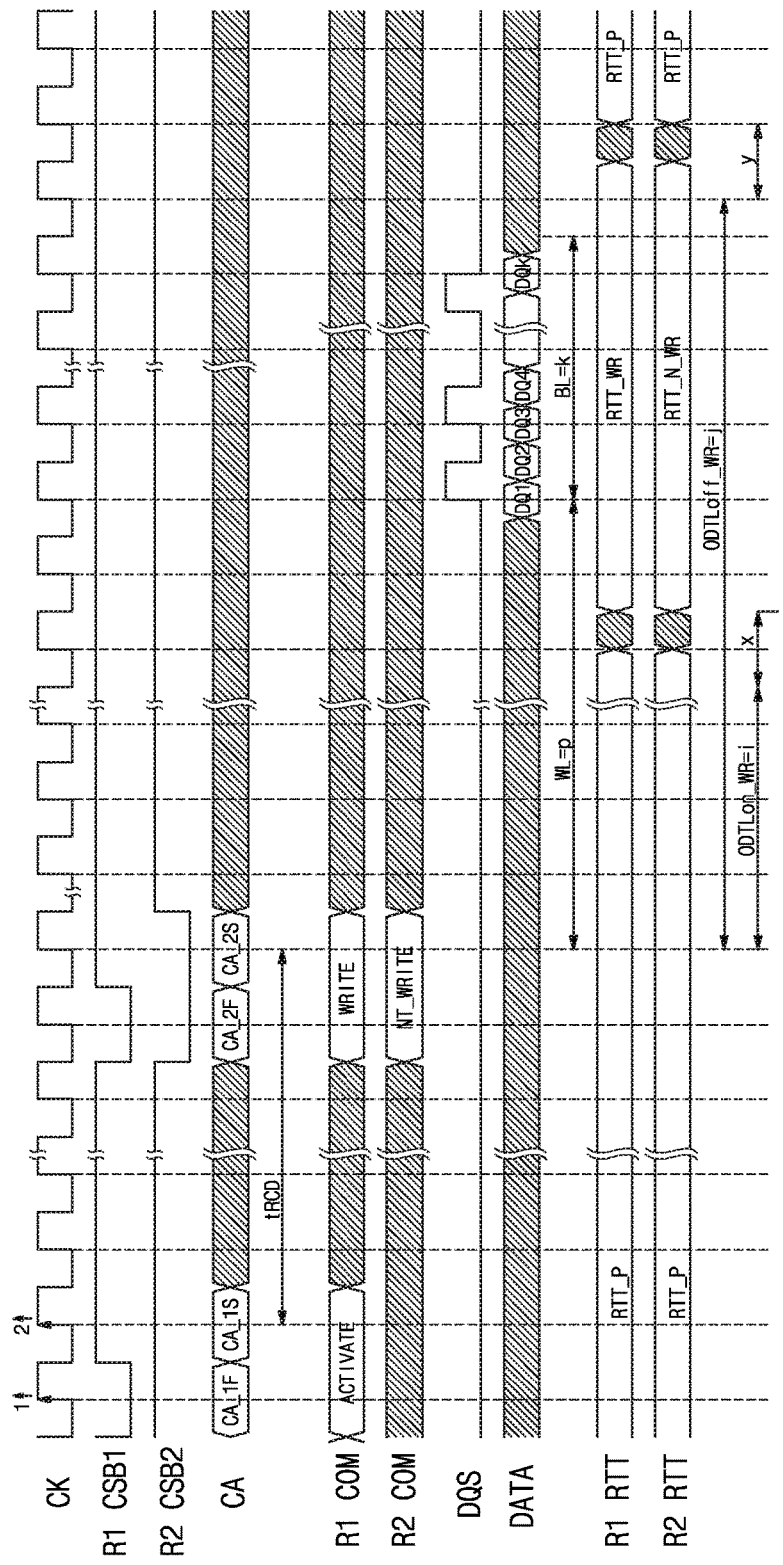

SEMICONDUCTOR MEMORY DEVICE AND MEMORY SYSTEM

CROSS-REFERENCE TO RELATED APPLICATIONS

This application claims priority under 35 U.S.C. § 119 to Korean Patent Application No. 10-2017-0168144, filed on Dec. 8, 2017, the disclosure of which is incorporated by reference herein in its entirety.

TECHNICAL FIELD

Exemplary embodiments of the inventive concept relate to a semiconductor memory device and a memory system.

DISCUSSION OF THE RELATED ART

A computer bus operating with double data rate (DDR) transfers data on both the rising and falling edges of a clock signal. DDR SDRAM (also referred to as DDR1 SDRAM) is a double rate synchronous dynamic random-access memory class of memory integrated circuits used in computers. DDR1 SDRAM has been superseded by DDR2 SDRAM, DDR3 SDRAM, and DDR4 SDRAM.

The specification for DDR4 has features that rely on an on-die termination terminal to which an on-die termination control signal is applied. However, due to the on-die terminal, a system employing DDR4 memory uses a large number of external terminals (pins or balls). Further, a system employing DDR4 memory cannot operate in response to a clock signal having a frequency beyond a certain threshold frequency.

SUMMARY

Exemplary embodiments of the inventive concept provide a semiconductor memory device which receives a command signal applied according to a new command truth table for supporting a double data rate (DDR) 5 semiconductor memory device, and a memory system including the semiconductor memory device.

According to an exemplary embodiment of the inventive concept, a semiconductor memory device includes: a first buffer configured to buffer a clock signal applied from the outside to generate a buffered clock signal; a second buffer configured to invert and buffer an inverted chip selection signal applied to generate a buffered chip selection signal; a third buffer configured to buffer a command and address to generate a buffered command and address; a frequency divider configured to divide a frequency of the buffered clock signal to generate a first clock signal and a second clock signal having phases inverted from each other; a first sampler configured to output the buffered chip selection signal as a first chip selection signal in response to the first clock signal, output the buffered chip selection signal as a second chip selection signal in response to the second clock signal, and output the first chip selection signal as a third chip selection signal in response to the second clock signal; a second sampler configured to output the buffered command and address as a first command and address in response to the first clock signal, and output the buffered command and address as a second command and address in response to the second clock signal; a signal detector configured to output the first chip selection signal as a first selection signal in response to the first clock signal, and output the third chip selection signal as a second selection signal in response to the second clock signal; a control circuit configured to output the first command and address as a first internal command and address in response to the first selection signal, and output the second command and address as a second internal command and address in response to the second selection signal; a flag signal generator configured to generate a flag signal using the first chip selection signal and the second chip selection signal; and a command decoder and address generator configured to decode a command signal included in the first internal command and address and the second internal command and address in response to the flag signal to generate a target command or a non-target command.

According to an exemplary embodiment of the inventive concept, a semiconductor memory device includes: a frequency divider configured to divide a frequency of a clock signal to generate a first clock signal and a second clock signal having phase inverted from each other; a first sampler configured to sample a chip selection signal in response to the first clock signal and the second clock signal to generate a first chip selection signal and a second chip selection signal, and output the first chip selection signal as a third chip selection signal in response to the second clock signal; a second sampler configured to sample a command and address in response to the first clock signal and the second clock signal to generate a first command and address and a second command and address; a signal detector configured to output the first chip selection signal as a first selection signal in response to the first clock signal and output the third chip selection signal as a second selection signal in response to the first clock signal and the second clock signal; a control circuit configured to output the first command and address and the second command and address as a first internal command and address and a second internal command and address in response to the first selection signal and the second selection signal; and a flag signal generator configured to generate a flag signal using the first chip selection signal and the second chip selection signal.

According to an exemplary embodiment of the inventive concept, a memory system includes: a controller; a first rank including a plurality of first semiconductor memory devices; a second rank including a plurality of second semiconductor memory devices; a first inverted chip selection signal line connected between the controller and the first rank, and configured to transmit a first inverted chip selection signal; a second inverted chip selection signal line connected between the controller and the second rank, and configured to transmit a second inverted chip selection signal; a clock signal line shared by the controller, the first rank, and the second rank, and configured to transmit a clock signal; command and address lines shared by the controller, the first rank, and the second rank, and configured to transmit a command and address; and data lines shared by the controller, the first rank, and the second rank, and configured to transceive data, wherein the controller applies the command and address together with the first inverted chip selection signal and the second inverted chip selection signal having deactivation states at a first rising edge of the clock signal, and applies the command and address together with the first inverted chip selection signal having an activation state and the second inverted chip selection signal having an deactivation state at a second or third rising edge of the clock signal according to a mode signal, and each of the semiconductor memory devices includes a command and address generator which generates divided first and second clock signals by dividing a frequency of the clock signal according to the mode signal, when the first clock signal has an earlier phase than the second clock signal, outputs the first inverted chip selection signal as a first chip selection signal in response to the first clock signal, outputs the second inverted chip selection signal as a second chip selection signal in response to the second clock signal, outputs the first chip selection signal as a third chip selection signal in response to the second clock signal, outputs the command and address as a first command and address in response to the first clock signal, outputs the command and address as a second command and address in response to the second clock signal, outputs the first chip selection signal as a first selection signal in response to the first clock signal, outputs the third chip selection signal as a second selection signal in response to the second clock signal, outputs the first command and address as a first internal command and address in response to the first selection signal, outputs the second command and address as a second internal command and address in response to the second selection signal, generates a flag signal using the first chip selection signal and the second chip selection signal, decodes a command signal included in the first internal command and address and the second internal command and address in response to the flag signal to generate a target command or a non-target command, and each of the semiconductor memory devices controls an on-die termination resistor in response to the target command and the non-target command.

According to an exemplary embodiment of the inventive concept, a semiconductor memory device includes a frequency divider, first and second samplers, a signal detector, a control circuit, a signal generator, and a command decoder and address generator. The frequency divider is configured to divide a frequency of a clock signal to generate a first clock signal and a second clock signal having phases inverted from each other. The first sampler is configured to sample a chip selection signal in response to the first clock signal and the second clock signal, generate a first chip selection signal and a second chip selection signal, and output the first chip selection signal as a third chip selection signal in response to the second clock signal. The second sampler is configured to sample a command and address in response to the first clock signal and the second clock signal to generate a first command and address and a second command and address. The signal detector is configured to output the first chip selection signal as a first selection signal in response to the first clock signal, and output the third chip selection signal as a second selection signal in response to the second clock signal. The control circuit is configured to output the first command and address and the second command and address as a first internal command and address and a second internal command and address in response to the first selection signal and the second selection signal. The signal generator is configured to generate a flag signal using the first chip selection signal and the second chip selection signal. The command decoder and address generator is configured to decode a command signal included in the first internal command and address and the second internal command and address in response to the flag signal to generate a target command or a non-target command.

BRIEF DESCRIPTION OF THE DRAWINGS

The present inventive concept will become more apparent by describing in detail exemplary embodiments thereof with reference to the accompanying drawings, in which:

FIG. 2 is a command truth table of a command and address which is applied from a controller of a memory system to a semiconductor memory device according to an exemplary embodiment of the inventive concept;

FIGS. 3A and 3B are timing diagrams for describing an operation of a memory system according to an exemplary embodiment of the inventive concept;

DETAILED DESCRIPTION OF THE EXEMPLARY EMBODIMENTS

Hereinafter, a semiconductor memory device and a memory system according to exemplary embodiments of the inventive concept will be described with reference to the accompanying drawings.

Figure 1:
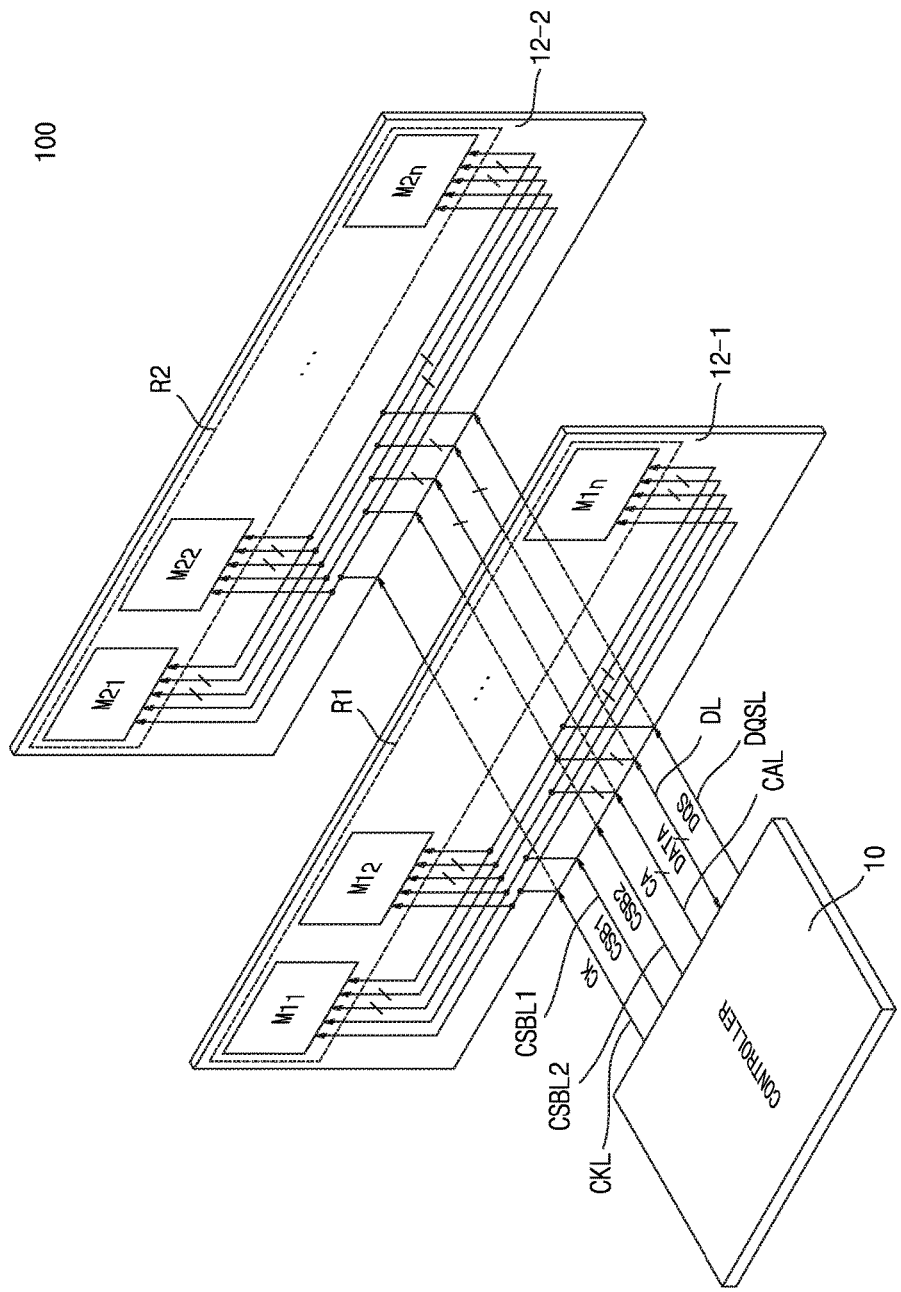
FIG. 1 is a diagram illustrating a memory system according to an exemplary embodiment of the inventive concept.

FIG. 1 is a diagram illustrating a memory system according to an exemplary embodiment of the inventive concept.

Referring to FIG. 1, in an exemplary embodiment, a memory system 100 includes a controller 10 (e.g., a control circuit), a first memory module 12-1 (e.g., a first memory card) including a first rank R1 including n first semiconductor memory devices M11 to M1n, a second memory module 12-2 (e.g., a second memory card) including a second rank R2 including n second semiconductor memory devices M21 to M2n, a clock signal line CKL shared by the controller 10, the first rank R1, and the second rank R2 and transmitting a clock signal CK, a first inverted chip selection signal line CSBL1 connected between the controller 10 and the first rank R1 and transmitting a first inverted chip selection signal CSB1, a second inverted chip selection signal line CSBL2 connected between the controller 10 and the second rank R2 and transmitting a second inverted chip selection signal CSB2, command and address lines CAL shared by the controller 10, the first rank R1, and the second rank R2 and transmitting a command and address CA, data lines DL shared by the controller 10, the first rank R1, and the second rank R2 and transceiving data DATA, and a data strobe signal line DQSL shared by the controller 10, the first rank R1, and the second rank R2 and transceiving a data strobe signal DQS.

In FIG. 1, an example in which the first rank R1 and the second rank R2 are installed in different memory modules 12-1 and 12-2 is illustrated, but the first rank R1 and the second rank R2 may be installed in the same memory module. Each of the clock signal CK and the data strobe signal DQS may be a differential signal pair in which each of an inverted clock signal (not shown) and an inverted data strobe signal (not shown) is transmitted together. When each of the first semiconductor memory devices M11 to M1n and each of the second semiconductor memory devices M21 to M2n input and output 8-bit data, the total number of data lines DL may be configured to be 8n.

FIG. 2 is a command truth table of a command and address which is applied from a controller of a memory system to a semiconductor memory device according to an exemplary embodiment of the inventive concept, and illustrates an example in which a command and address CA is transmitted through r command and address lines CAL.

Referring to FIGS. 1 and 2, the controller 10 applies "low" levels as signals CA1 and CA2 of the command and address CA together with an inverted chip selection signal CSB having the "low" level at a first rising edge of a clock signal CK, in order to apply an activate command ACTIVATE. The controller 10 applies a "high" level, the "low" level, the "high" level, the "high" level, and the "low" level as signals CA1 to CA5 of the command and address CA together with the inverted chip selection signal CSB having the "low" level at the first rising edge of the clock signal CK, in order to apply a write command WRITE and a non-target write command NT_WRITE, applies the inverted chip selection signal CSB having the "high" level at a second rising edge of the clock signal CK in order to apply the write command WRITE, and applies the inverted chip selection signal CSB having the "low" level at the second rising edge of the clock signal CK in order to apply the non-target write command NT_WRITE. In an embodiment, a write command WRITE is applied to a first memory device that is the target of a write operation for writing data while a non-target write command NT_WRITE is applied to a second memory device, where the data is written to the first memory device using the write command WRITE and the data is not written to the second memory device using the non-target write command NT_WRITE. The controller 10 applies the "high" level, the "low" level, the "high" level, the "high" level, and the "high" level as the signals CA1 to CA5 of the command and address CA together with the inverted chip selection signal CSB having the "low" level at the first rising edge of the clock signal CK in order to apply a read command READ and a non-target read command NT_READ, applies the inverted chip selection signal CSB having the "high" level at the second rising edge of the clock signal CK in order to apply the read command READ, and applies the inverted chip selection signal CSB having the "low" level at the second rising edge of the clock signal CK in order to apply the non-target read command NT_READ. In an embodiment, a read command READ is applied to a first memory device that is the target of a read operation for read data while a non-target read command NT_READ is applied to a second memory device, where the data is read from the first memory device using the read command READ and the data is not read from the second memory device using the non-target read command NT_READ. The controller 10 applies the "high" level, the "low" level, the "high" level, the "low" level, and the "low" level as the signals CA1 to CA5 of the command and address CA together with the inverted chip selection signal CSB having the "low" level at the first rising edge of the clock signal CK in order to apply a mode setting command MODE REGISTER SET, and applies the inverted chip selection signal CSB having the "high" level at the second rising edge of the clock signal CK in order to apply the mode setting command MODE REGISTER SET.

The controller 10 applies a row address as signals of a portion represented by "|" when applying the activate command ACTIVATE. The controller 10 applies a column address as signals of a portion represented by "||" when applying the write command WRITE or the read command READ. The controller 10 applies a mode setting code as signals of a portion represented by "|||" when applying the mode setting command MODE REGISTER SET. In FIG. 2, signals of a portion represented by "X" may have "don't care" states. However, since the controller 10 applies both the write command WRITE and the non-target write command NT_WRITE and applies both the read command READ and the non-target read command NT_READ, the signals of the portion represented by "X" applied together with the non-target write command NT_WRITE and the non-target read command NT_READ may be the same as the signals of the portion represented by "||" applied together with the write command WRITE and the read command READ.

The controller 10 may apply the inverted chip selection signal CSB and the command and address CA according to the command truth table described above in a first mode 1 M1. The controller 10 may apply the command and address CA at a third rising edge rather than the second rising edge of the clock signal CK in a second mode 2 M2.

Figure 3B:
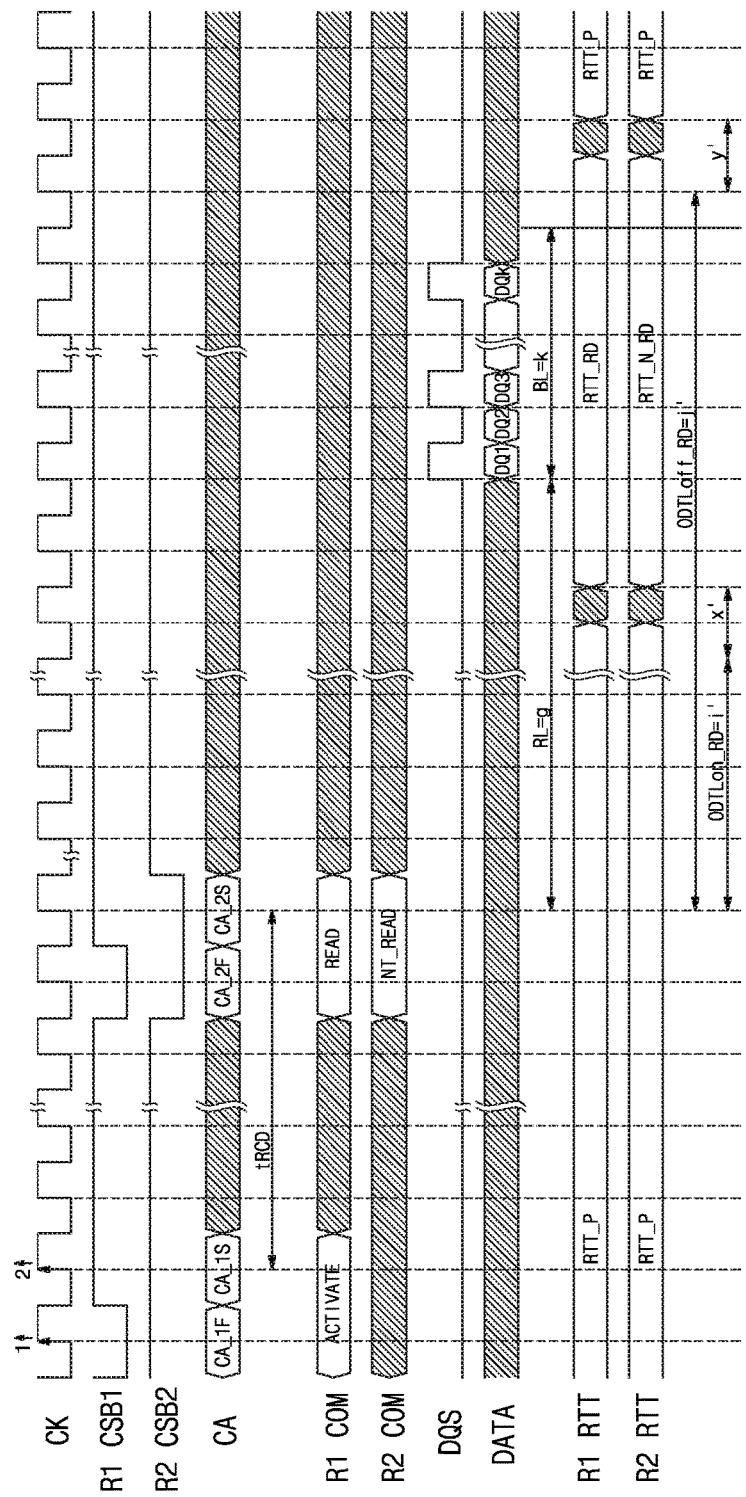

FIGS. 3A and 3B are timing diagrams for describing an operation of a memory system according to an exemplary embodiment of the inventive concept. The timing diagrams may be used to illustrate when the first rank R1 of the memory system 100 shown in FIG. 1 is a target rank performing a read operation or a write operation. The timing diagrams may be used to illustrate when the second rank R2 is a non-target rank not performing the read operation or not performing the write operation. The timing diagrams illustrate the clock signal CK, the inverted chip selection signals CSB1 and CSB2, the command and address CA, the data DATA, and the data strobe signal DQS, which are shown in FIG. 1. The timing diagrams illustrate values of an on-die termination resistor R1 RTT of each of the plurality of first semiconductor memory devices M11 to M1n included in the first rank R1 and an on-die termination resistor R2 RTT of each of the plurality of second semiconductor memory devices M21 to M2n included in the second rank R2. Further, examples in which each of the plurality of first semiconductor memory devices M11 to M1n and second semiconductor memory devices M21 to M2n is set to the first mode 1 M1, values of a write latency WL, a read latency RL, and a burst length BL are set to p, q, and k, respectively. Values of an on-die termination on write latency ODTLon_WR, an on-die termination off write latency ODTLoff_WR, an on-die termination on read latency ODTLon_RD, an on-die termination off read latency ODTLoff_RD are set to i, j, i', and j', respectively, are illustrated. FIG. 3A is a timing diagram when the write command is applied, and FIG. 3B is a timing diagram when the read command is applied.

Referring to FIGS. 1 to 3A, the controller 10 applies the activate command ACTIVATE to the first rank R1, and applies the write command WRITE to the first rank R1 and the non-target write command NT_WRITE to the second rank R2 after a first predetermined time tRCD. Further, the controller 10 sequentially inputs data DQ1 to DQk input to be aligned at the center of the data strobe signal DQS during the number of clock cycles (i.e. k/2 clock cycles) corresponding to k which is the value of the burst length BL after the number of clock cycles corresponding to p which is the value of the write latency WL after applying a command and address CA_2S.

When the write command WRITE is applied, each of the plurality of first semiconductor memory devices M11 to M1n included in the first rank R1 changes the on-die termination resistor R1 RTT connected to each of data terminals (not shown) and data strobe signal terminals (not shown) of each of the plurality of first semiconductor memory devices M11 to M1n from a first value RTT_P to a second value RTT_WR. When the non-target write command NT_WRITE is applied, each of the plurality of second semiconductor memory devices M21 to M2n included in the second rank R2 changes the on-die termination resistor R2 RTT connected to each of data terminals (not shown) and data strobe signal terminals (not shown) of each of the plurality of second semiconductor memory devices M21 to M2n from the first value RTT_P to a third value RTT_N_WR. The first value RTT_P may be values of the on-die termination resistors R1 RTT and R2 RTT to be provided. The second value RTT_WR may be a value of the on-die termination resistors R1 RTT and R2 RTT to be provided when the write command WRITE is applied. The third value RTT_N_WR may be a value of the on-die termination resistor R2 RTT to be provided when the non-target write command NT_WRITE is applied. In an embodiment, each of the plurality of first semiconductor memory devices M11 to M1n included in the first rank R1 provides the on-die termination resistor R1 RTT having the first value RTT_P until the number of clock cycles corresponding to i elapses, where i is the value of the on-die termination on write latency ODTLon_WR after the command and address CA_2S is applied, changes the value of the on-die termination resistor R1 RTT from the first value RTT_P to the second value RTT_WR (each of the plurality of second semiconductor memory devices M21 to M2n included in the second rank R2 may change the value of the on-die termination resistor R2 RTT from the first value RTT_P to the third value RTT_N_WR) during a second predetermined time x, and provides the on-die termination resistor R2 RTT having the second value RTT_WR (each of the plurality of second semiconductor memory devices M21 to M2n included in the second rank R2 may provide the on-die termination resistor R2 RTT having the third value RTT_N_WR) until the number of clock cycles corresponding to j elapses, where j is the value of the on-die termination off write latency ODTLoff_WR. Further, in an exemplary embodiment, each of the plurality of first semiconductor memory devices M11 to M1n included in the first rank R1 changes the value of the on-die termination resistor R1 RTT from the second value RTT_WR to the first value RTT_P (each of the plurality of second semiconductor memory devices M21 to M2n included in the second rank R2 may change the value of the on-die termination resistor R2 RTT from the third value RTT_N_WR to the first value RTT_P) during a third predetermined time y after the number of clock cycles corresponding to j elapses, where j is the value of the on-die termination off write latency ODTLoff_WR. The values of the on-die termination on write latency ODTLon_WR and the on-die termination off write latency ODTLoff_WR may be values set based on the values of the write latency WL and the burst length BL, and be set by the mode setting code applied together with the mode setting command.

Referring to FIGS. 1 to 3B, the controller 10 applies the activate command ACTIVATE to the first rank R1, and applies the read command READ to the first rank R1 and the non-target read command NT_READ to the second rank R2 after the first predetermined time tRCD.

When the read command READ is applied, each of the plurality of first semiconductor memory devices M11 to M1n included in the first rank R1 output data DQ1 to DQk to be aligned at an edge of the data strobe signal DQS during the number of clock cycles (i.e. k/2 clock cycles) corresponding to k which is the value of the burst length BL after the number of clock cycles corresponding to q has elapsed, where q is the value of the read latency RL after applying the command and address CA_2S. Further, when the read command READ is applied, each of the plurality of first semiconductor memory devices M11 to M1n included in the first rank R1 changes a value of the on-die termination resistor R1 RTT connected to the data terminals (not shown) and the data strobe signal terminals (not shown) of each of the plurality of first semiconductor memory devices M11 to M1n from the first value RTT_P to a fourth value RTT_RD. When the non-target read command NT_READ is applied, each of the plurality of second semiconductor memory devices M21 to M2n included in the second rank R2 changes a value of the on-die termination resistor R2 RTT connected to each of the data terminals (not shown) and the data strobe signal terminals (not shown) of each of the plurality of second semiconductor memory devices M21 to M2n from the first value RTT_P to a fifth value RTT_N_RD. The fourth value RTT_RD is a value of the on-die termination resistor R2 RTT to be provided when the read command READ is applied. In an embodiment, the fourth value RTT_RD means an high-impedance state in which the on-die termination resistor R2 RTT is not connected to each of the data terminals (not shown) and the data strobe signal terminals (not shown). The fifth value RTT_N_RD is the value of the on-die termination resistor R2 RTT to be provided when the non-target read command NT_READ is applied. In an embodiment, each of the plurality of first semiconductor memory devices M11 to M1n included in the first rank R1 provides the on-die termination resistor R2 RTT having the first value RTT_P until the number of clock cycles corresponding to i' elapses, where i' is the value of the on-die termination on read latency ODTLon_RD. In an embodiment, each of the plurality of first semiconductor memory devices M11 to M1n changes the value of the on-die termination resistor R2 RTT from the first value RTT_P to the fourth value RTT_RD (each of the plurality of second semiconductor memory devices M21 to M2n included in the second rank R2 changes the value of the on-die termination resistor R2 RTT from the first value RTT_P to the fifth value RTT_N_RD) during a fourth predetermined time x'. In an embodiment, each of the plurality of first semiconductor memory devices M11 to M1n provide the on-die termination resistor R2 RTT having the fourth value RTT_RD (each of the plurality of second semiconductor memory devices M21 to M2n included in the second rank R2 provide the on-die termination resistor R2 RTT having the fifth value RTT_N_RD) until the number of clock cycles corresponding to j' has elapsed, where j' is the value of the on-die termination off read latency ODTLoff_RD. Further, each of the plurality of first semiconductor memory devices M11 to M1n included in the first rank R1 changes the value of the on-die termination resistor R1 RTT from the fourth value RTT_RD to the first value RTT_P (each of the plurality of second semiconductor memory devices M21 to M2n included in the second rank R2 changes the value of the on-die termination resistor R2 RTT from the fifth value RTT_N_RD to the first value RTT_P) during a fifth predetermined time y' after the number of clock cycles corresponding to j' elapses, where j' is the value of the on-die termination off read latency ODTLoff_RD. In an embodiment, the values of the on-die termination on read latency ODTLon_RD and the on-die termination off read latency ODTLoff_RD are values set according to the values of the read latency RL and the burst length BL, and are set by the mode setting code applied together with the mode setting command.

Figure 4:
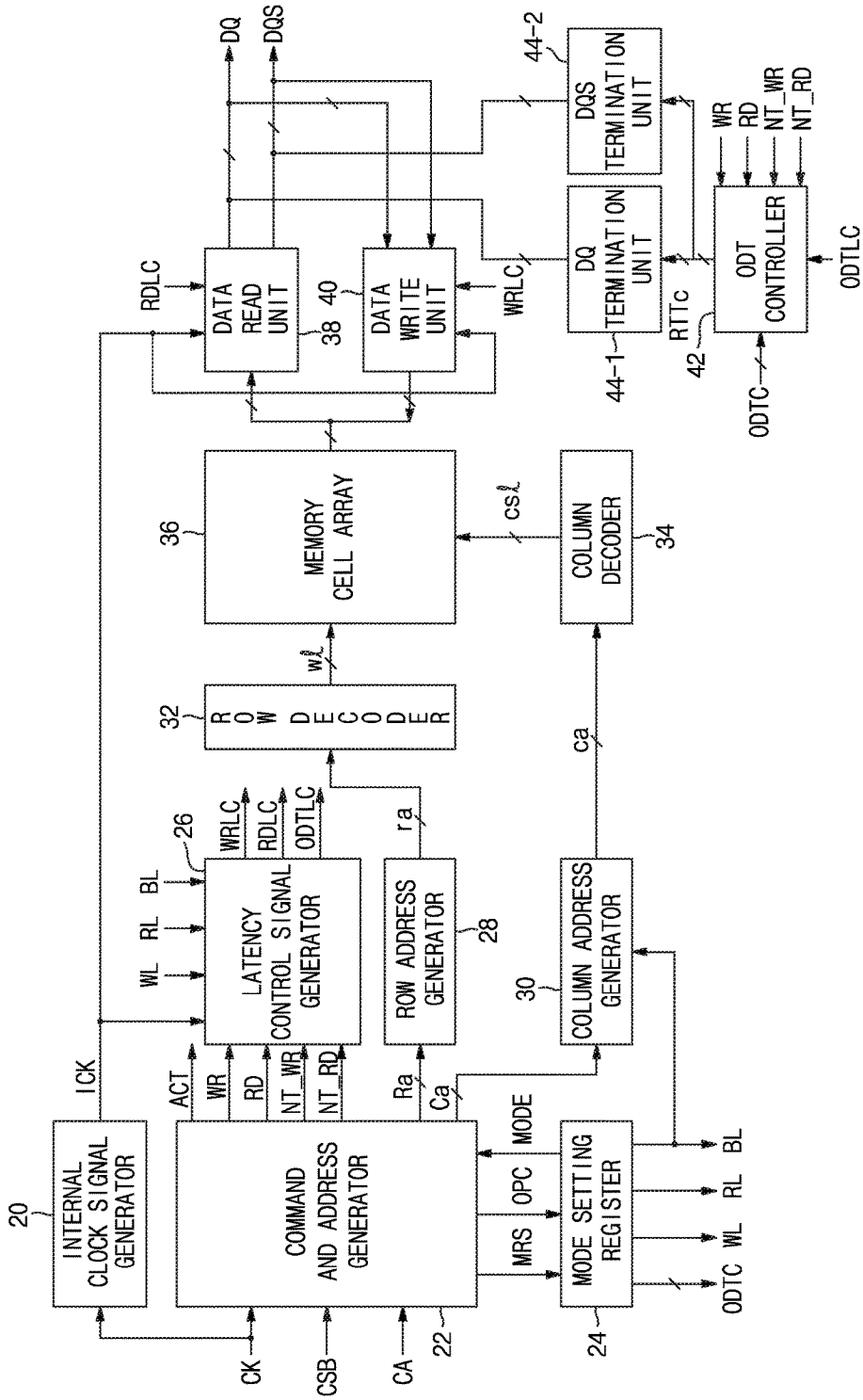
FIG. 4 is a block diagram illustrating a configuration of a semiconductor memory device according to an exemplary embodiment of the inventive concept.

FIG. 4 is a block diagram illustrating a configuration of a semiconductor memory device according to an exemplary embodiment of the inventive concept. The semiconductor memory device 200 includes an internal clock signal generator 20, a command and address generator 22, a mode setting register 24, a latency control signal generator 26, a row address generator 28, a column address generator 30, a row decoder 32 (e.g., a row decoding circuit), a column decoder 34 (e.g., a column decoding circuit), a memory cell array 36, a data read unit 38 (e.g., an output circuit), a data write unit 40 (e.g., an input circuit), an on-die termination (ODT) controller 42 (e.g., a control circuit), a data (DQ) termination unit 44-1 (e.g., a termination circuit), and a data strobe signal (DQS) termination unit 44-2 (e.g., a termination circuit).

A function of each of the blocks shown in FIG. 4 will be described below.

The internal clock signal generator 20 receives a clock signal CK applied from an outside source and generates an internal clock signal ICK synchronized with the clock signal CK.

The command and address generator 22 receives the clock signal CK, an inverted chip selection signal CSB, and a command and address CA input based on the command truth table shown in FIG. 2 according to a mode signal MODE. The command and address generator 22 is configured to decode a command signal included in the command and address CA to generate a mode setting command MRS, an active command ACT, a write command WR, a read command RD, a non-target write command NT_WR, or a non-target read command NT_RD. The command and address generator 22 generates a row address Ra, a column address Ca, or a mode setting code OPC from an address signal included in the command and address CA.

The mode setting register 24 receives the mode setting code OPC in response to the mode setting command MRS, and set values of the write latency WL, the read latency RL, and the burst length BL, an on-die termination code ODTC for setting the value of the on-die termination resistor. Further, the mode setting register 24 sets the mode signal MODE according to a value of the mode setting code OPC. For example, the on-die termination code ODTC may be a value for setting the first value RTT_P, the second value RTT_WR, the third value RTT_N_WR, the fourth value RTT_RD, and the fifth value RTT_N_RD described above. For example, the on-die termination code ODTC may indicate a particular resistance. The mode signal MODE may be a signal for setting the first mode 1 M1 and the second mode 2 M2. Further, although not shown, the mode setting register 24 may set the values of the on-die termination on write latency ODTLon_WR, the on-die termination off write latency ODTLoff_WR, the on-die termination on read latency ODTLon_RD, and the on-die termination off read latency ODTLoff_RD according to the mode setting code OPC.

In an embodiment, when the write command WR is generated, the latency control signal generator 26 generates a write latency control signal WRLC which is activated after being delayed by the number of clock cycles corresponding to the value of the write latency WL in response to the internal clock signal ICK and is deactivated after being delayed by the number of clock cycles corresponding to the value of the burst length BL. In an embodiment, when the read command RD is generated, the latency control signal generator 26 generates a read latency control signal RDLC which is activated after being delayed by the number of clock cycles corresponding to the value of the read latency RL in response to the internal clock signal ICK and is deactivated after being delayed by the number of clock cycles corresponding to the value of the burst length BL. The write latency control signal WRLC and the read latency control signal RDLC may be generated to have a predetermined margin before and after an activation period. In an embodiment, when the write command WR or the non-target write command NT_WR is generated, the latency control signal generator 26 generates an on-die termination latency control signal ODTLC which is activated after being delayed by the number of clock cycles corresponding to the value of the on-die termination on write latency ODTLon_WR and is deactivated after being delayed by the number of clock cycles corresponding to the value of the on-die termination off write latency ODTLoff_WR. In an embodiment, when the read command RD or the non-target read command NT_RD is generated, the latency control signal generator 26 generates the on-die termination latency control signal ODTLC which is activated after being delayed by the number of clock cycles corresponding to the value of the on-die termination on read latency ODTLon_RD and is deactivated after being delayed by the number of clock cycles corresponding to the value of the on-die termination off read latency ODTLoff_RD.

The row address generator 28 receives the row address Ra, and generates a row address signal ra from the row address Ra.

The column address generator 30 receives the column address Ca, and generates a column address signal ca by the number of times corresponding to the value of the burst length BL based on the column address Ca.

The row decoder 32 decodes the row address signal ra to select one among word line selection signals wl.

The column decoder 34 decodes the column address signal ca to select one among column selection signals csl.

The memory cell array 36 may write/read data to/from memory cells (not shown) selected by the selected one word line selection signal wl and the selected one column selection signal csl.

The data read unit 38 may receive the data read from the selected memory cells, and sequentially output data DQ to be aligned at an edge of the data strobe signal DQS generated in response to the internal clock signal ICK during the activation period of the read latency control signal RDLC.

The data write unit 40 may sequentially input data DQ input to be aligned at a center of the data strobe signal DQS input from an outside source during the activation period of the write latency control signal WRLC, and output the input data to the memory cell array 36 in response to the internal clock signal ICK.

In an embodiment, when the write command WR, the non-target write command NT_WR, the read command RD, or the non-target read command NT_RD is generated, the ODT controller 42 outputs the on-die termination code ODTC for changing the value of the on-die termination resistor to the second value RTT_WR, the third value RTT_N_WR, the fourth value RTT_RD, and the fifth value RTT_N_RD which are the values of the on-die termination resistor corresponding to the write command WR, the non-target write command NT_WR, the read command RD, and the non-target read command NT_RD as a variable resistance code RTTc in response to the on-die termination latency control signal ODTLC.

The DQ termination unit 44-1 changes the value of the on-die termination resistor applied to the data DQ terminals (not shown) in response to the resistance variable code RTTc.

The DQS termination unit 44-2 changes the value of the on-die termination resistor applied to the data strobe signal DQS terminals (not shown) in response to the resistance variable code RTTc.

Figure 5:
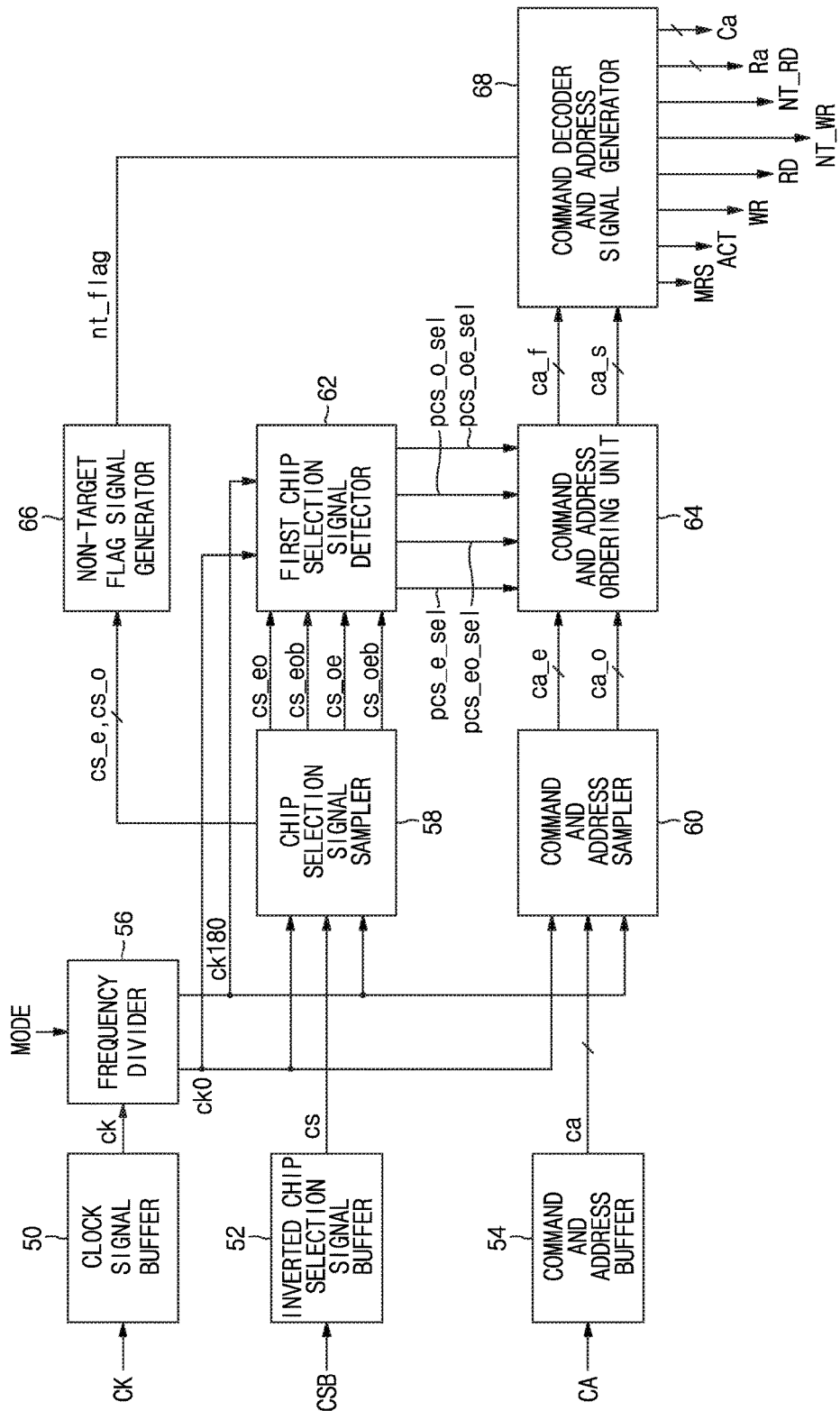
FIG. 5 is a block diagram illustrating a configuration of a command and address generator according to an exemplary embodiment of the inventive concept.

FIG. 5 is a detailed block diagram illustrating a configuration of the command and address generator 22 according to an exemplary embodiment of the inventive concept. The command and address generator 22 includes a clock signal buffer 50 (e.g., a buffer circuit), an inverted chip selection signal buffer 52, a command and address buffer 54, a frequency divider 56, a chip selection signal sampler 58, a command and address sampler 60, a first chip selection signal detector 62 (e.g., a signal detection circuit), a command and address ordering unit 64, a non-target flag signal generator 66, and a command decoder and address generator 68.

A function of each of the blocks shown in FIG. 5 will be described below.

The clock signal buffer 50 buffers the clock signal CK, and generates a buffered clock signal ck. The inverted chip selection signal buffer 52 buffers the inverted chip selection signal CSB, and generates a buffered chip selection signal cs. The command and address buffer 54 buffers the command and address CA, and generate a buffered command and address ca. The frequency divider 56 divides a frequency of the clock signal ck by a first value when the mode signal MODE is set to the first mode 1 M1, divides the frequency of the clock signal ck by a second value when the mode signal MODE is set to the second mode 2 M2, and generates a first clock signal ck0 and a second clock signal ck180 having a phase difference of 180-degree apart from each other. In an embodiment, the first value is 2 and the second value is 4. The first clock signal ck0 output from the frequency divider 56 may have an earlier phase than the second clock signal ck180. However, due to uncertainty of an operation of the frequency divider 56, the second clock signal ck180 output from the frequency divider 56 may have an earlier phase than the first clock signal ck0.

In an embodiment, when the first clock signal ck0 has an earlier phase than the second clock signal ck180, the chip selection signal sampler 58 outputs the buffered chip selection signal cs as a first chip selection signal cs_e in response to the first clock signal ck0, outputs the buffered chip selection signal cs as a second chip selection signal cs_o in response to the second clock signal ck180, and outputs the first chip selection signal cs_e as a third chip selection signal cs_eo in response to the second clock signal ck180. In an embodiment, when the second clock signal ck180 has an earlier phase than the first clock signal ck0, the chip selection signal sampler 58 outputs the buffered chip selection signal cs as the second chip selection signal cs_o in response to the second clock signal ck180, outputs the buffered chip selection signal cs as the first chip selection signal cs_e in response to the first clock signal ck0, and outputs the second chip selection signal cs_o as a fourth chip selection signal cs_oe in response to the first clock signal ck0.

In an embodiment, when the first clock signal ck0 has an earlier phase than the second clock signal ck180, the command and address sampler 60 generates the buffered command and address ca as a first command and address ca_e in response to the first clock signal ck0, and generates the buffered command and address ca as a second command and address ca_o in response to the second clock signal ck180. In an embodiment, when the second clock signal ck180 has an earlier phase than the first clock signal ck0, the command and address sampler 60 generates the buffered command and address ca as the second command and address ca_o in response to the second clock signal ck180, and generates the buffered command and address ca as the first command and address ca_e in response to the first clock signal ck0.

In an embodiment, when the first clock signal ck0 has an earlier phase than the second clock signal ck180, the first chip selection signal detector 62 outputs the first chip selection signal cs_e as a first selection signal pcs_e_sel in response to the first clock signal ck0, and outputs the third chip selection signal cs_eo as a third selection signal pcs_eo_sel in response to the second clock signal ck180. In an embodiment, when the second clock signal ck180 has an earlier phase than the first clock signal ck0, the first chip selection signal detector 62 outputs the second chip selection signal cs_o as a second selection signal pcs_o_sel in response to the second clock signal ck180, and outputs the fourth chip selection signal cs_oe as a fourth selection signal pcs_oe_sel in response to the first clock signal ck0.

In an embodiment, when the first clock signal ck0 has an earlier phase than the second clock signal ck180, the command and address ordering unit 64 generates the first command and address ca_e as a first internal command and address ca_f in response to the first selection signal pcs_e_sel, and generates the second command and address ca_o as a second internal command and address ca_s in response to the third selection signal pcs_eo_sel. In an embodiment, when the second clock signal ck180 has an earlier phase than the first clock signal ck0, the command and address ordering unit 64 generates the second command and address ca_o as the first internal command and address ca_f in response to the second selection signal pcs_o_sel, and generates the first command and address ca_e as the second internal command and address ca_s in response to the fourth selection signal pcs_oe_sel.

The non-target flag signal generator 66 combines the first chip selection signal cs_e and the second chip selection signal cs_o to generate a non-target flag signal nt_flag.

In an embodiment, when the non-target flag signal nt_flag is deactivated, the command decoder and address generator 68 decode a command signal included in the first internal command and address ca_f and the second internal command and address ca_s to generate the mode setting command MRS, the active command ACT, the write command WR, or the read command RD. The command decoder and address generator 68 generates a row address Ra or a column address Ca from an address signal included in the first internal command and address ca_f and the second internal command and address ca_s. In an embodiment, when the non-target flag signal nt_flag is activated, the command decoder and address generator 68 generates the non-target write command NT_WR and the non-target read command NT_RD. The target command may include the write command WR or the read command RD, and the non-target command may include the non-target write command NT_WR or the non-target read command NT_RD.

Accordingly, the command and address generator 22 according to an exemplary embodiment shown in FIG. 5 may exactly operate even when the second clock signal ck180 has an earlier phase than the first clock signal ck0 due to the uncertainty of the operation of the frequency divider 56.

However, when the frequency divider 56 shown in FIG. 5 exactly performs an operation so that the first clock signal ck0 always has an earlier phase than the second clock signal ck180, the chip selection signal sampler 58, the command and address sampler 60, the first chip selection signal detector 62, and the command and address ordering unit 64 do not need to perform operations of the case in which the second clock signal ck180 has an earlier phase than the first clock signal ck0.

Figure 6A:
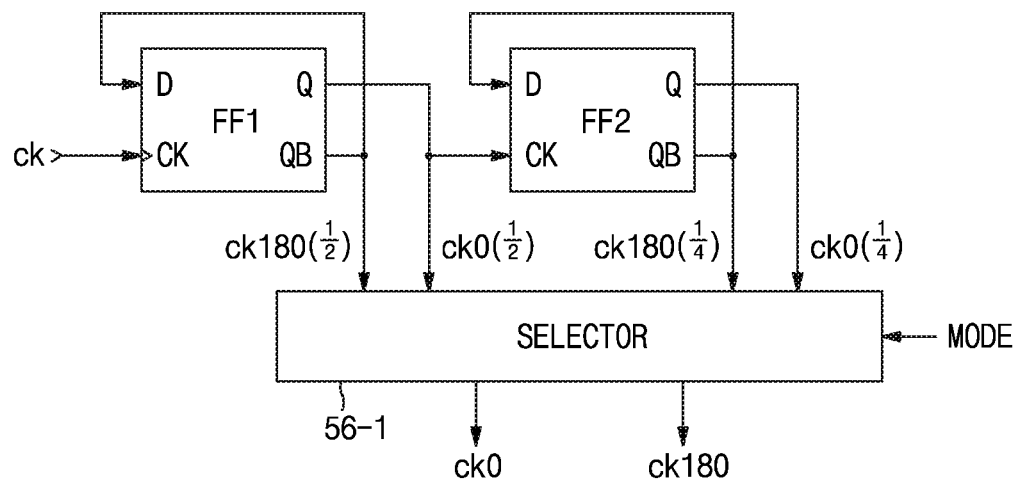
FIGS. 6A to 6F are diagrams illustrating configurations of a frequency divider, a command and address signal sampler, a chip selection signal sampler, a first chip selection signal detector, a command and address ordering unit, and a non-target flag signal generator shown in FIG. 5, respectively.

FIG. 6A is a diagram illustrating a configuration of the frequency divider 56 according to an exemplary embodiment of the inventive concept. The frequency divider 56 includes first and second flip-flops FF1 and FF2, and a selector 56-1. In an embodiment, the selector 56-1 is implemented by a multiplexer.

Referring to FIG. 6A, the first flip-flop FF1 generates a divided clock signal ck0(½) and an inverted clock signal ck180(½) by dividing the frequency of the buffered clock signal ck by 2 in response to the buffered clock signal ck, and the second flip-flop FF2 generates a divided clock signal ck0(¼) and an inverted clock signal ck180(¼) by dividing the divided clock signal ck0(½) by 2 in response to the divided clock signal ck0(½). In an embodiment, when the mode signal MODE is set to the first mode 1 M1, the selector 56-1 outputs the divided clock signals ck0(½) and ck180(½) as the first and second clock signals ck0 and ck180. In an embodiment, when the mode signal MODE is set to the second mode M2, the selector 56-1 outputs the divided clock signals ck0(¼) and ck180(¼) as the first and second clock signals ck0 and ck180.

Figure 6B:
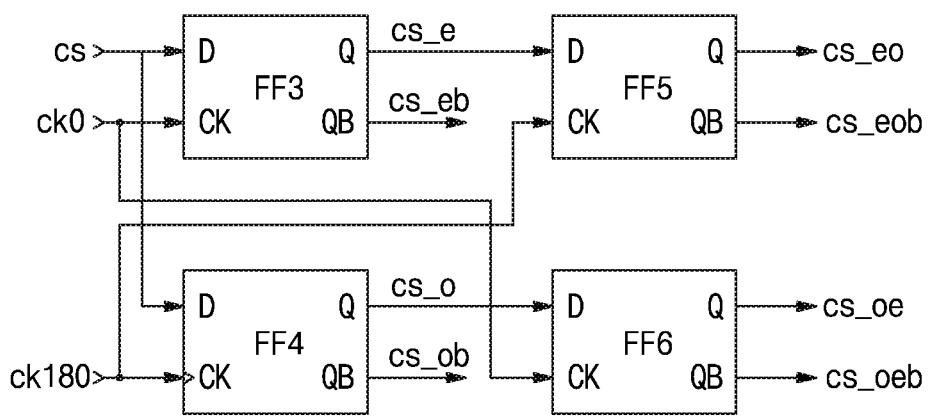

FIG. 6B is a diagram illustrating a configuration of the chip selection signal sampler 58 according to an exemplary embodiment of the inventive concept. The chip selection signal sampler 58 includes third to sixth flip-flops FF3 to FF6.

Referring to FIG. 6B, in an embodiment, the third flip-flop FF3 outputs the buffered chip selection signal cs as the first chip selection signal cs_e at a rising edge of the first clock signal ck0. For example, the buffered chip selection signal cs may be output to a data terminal D of the third flip-flop FF3 while the first clock signal ck0 is output to a clock terminal CK of the third flip-flop FF3. In an embodiment, the fourth flip-flop FF4 outputs the buffered chip selection signal cs as the second chip selection signal cs_o at a rising edge of the second clock signal ck180. For example, the buffered chip selection signal cs may be output to a data terminal D of the fourth flip-flop FF4 while the second clock signal ck180 is output to a clock terminal CK of the fourth flip-flop FF4. In an embodiment, the fifth flip-flop FF5 outputs the first chip selection signal cs_e as the third chip selection signal cs_eo at the rising edge of the second clock signal ck180. For example, the first chip selection signal cs_e may be output to a data terminal D of the fifth flip-flop FF5 while the second clock signal ck180 is output to a clock terminal CK of the fifth flip-flop FF5. In an embodiment, the sixth flip-flop FF6 outputs the second chip selection signal cs_o as the fourth chip selection signal cs_oe at the rising edge of the first clock signal ck0. For example, the second chip selection signal cs_o may be output to a data terminal D of the sixth flip-flop FF6 while the first clock signal ck0 is output to a clock terminal CK of the sixth flip-flop FF6. Further, the third to sixth flip-flops FF3 to FF6 may generate a first inverted chip selection signal cs_eb, a second inverted chip selection signal cs_ob, a third inverted chip selection signal cs_eob, and a fourth inverted chip selection signal cs_oeb, respectively.

Figure 6C:
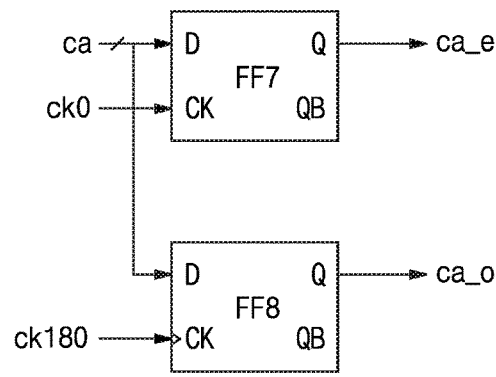

FIG. 6C is a diagram illustrating a configuration of the command and address sampler 60 according to an exemplary embodiment of the inventive concept. The command and address sampler 60 include seventh and eighth flip-flops FF7 and FF8.

Referring to FIG. 6C, in an embodiment, the seventh flip-flop FF7 outputs the buffered command and address ca as the first command and address ca_e at the rising edge of the first clock signal ck0. For example, the buffered command and address ca may be output to a data terminal D of the seventh flip-flop FF7 while the first clock signal ck0 is output to a clock terminal CK of the seventh flip-flop FF7. In an embodiment, the eighth flip-flop FF8 outputs the buffered command and address ca as the second command and address ca_o at the rising edge of the second clock signal ck180. For example, the buffered command and address ca may be output to a data terminal D of the eighth flip-flop FF8 while the second clock signal ck180 is output to a clock terminal CK of the eighth flip-flop FF8.

Figure 6D:
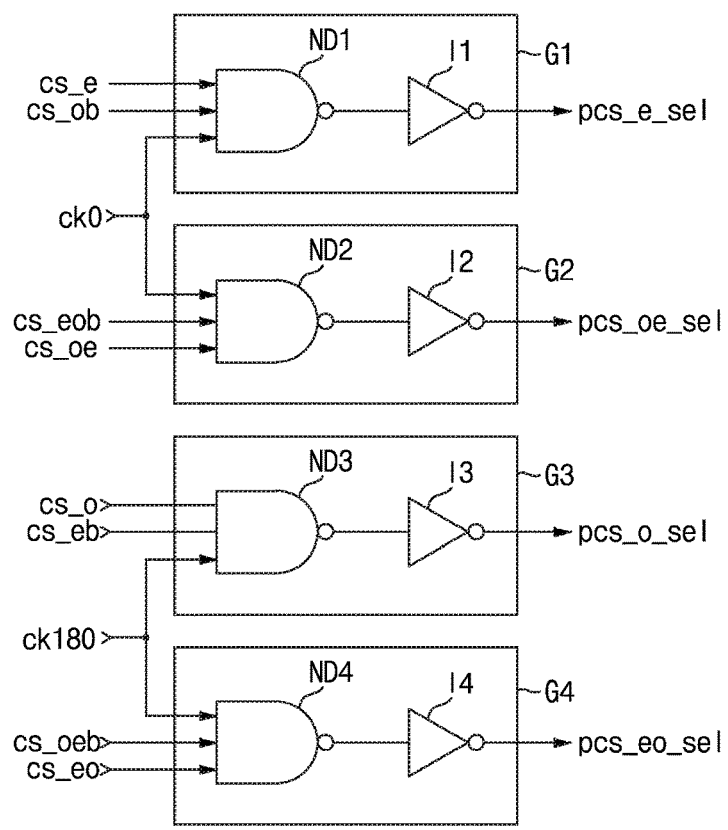

FIG. 6D is a diagram illustrating a configuration of the first chip selection signal detector 62 according to an exemplary embodiment of the inventive concept. The first chip selection signal detector 62 includes first to fourth logic gates G1 to G4. Each of the logic gates G1 to G4 may include each of NAND gates ND1 to ND4 and each of inverters I1 to I4.

Referring to FIG. 6D, the first logic gate G1 generates the first selection signal pcs_e_sel having the "high" level when the first clock signal ck0, the first chip selection signal cs_e, and the second inverted chip selection signal cs_ob have the "high" levels. The second logic gate G2 generates the fourth selection signal pcs_oe_sel having the "high" level when the first clock signal ck0, the third inverted chip selection signal cs_eob, and the fourth chip selection signal cs_oe have the "high" levels. The third logic gate G3 generates the second selection signal pcs_o_sel having the "high" level when the second clock signal ck180, the second chip selection signal cs_o, and the first inverted chip selection signal cs_eb have the "high" levels. The fourth logic gate G4 generates the third selection signal pcs_eo_sel having the "high" level when the second clock signal ck180, the fourth inverted chip selection signal cs_oeb, and the third chip selection signal cs_eo have the "high" levels.

Figure 6E:
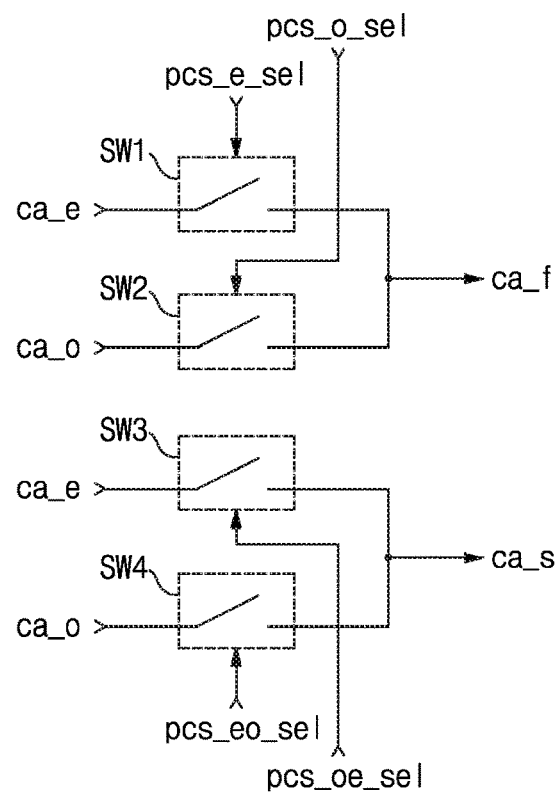

FIG. 6E is a diagram illustrating a configuration of the command and address ordering unit 64 according to an exemplary embodiment of the inventive concept. The command and address ordering unit 64 include switches SW1 to SW4.

Referring to FIG. 6E, the switch SW1 outputs the first command and address ca_e as the first internal command and address ca_f in response to the first selection signal pcs_e_sel. The switch SW2 outputs the second command and address ca_o as the first internal command and address ca_f in response to the second selection signal pcs_o_sel. The switch SW3 outputs the first command and address ca_e as the second internal command and address ca_s in response to the fourth selection signal pcs_oe_sel. The switch SW4 outputs the second command and address ca_o as the second internal command and address ca_s in response to the third selection signal pcs_eo_sel. In an embodiment, each of the switches SW1 to SW4 is implemented by a transistor, and a gate of the transistor receives one of the selections signals (e.g., pcs_e_sel, pcs_o_sel, pcs_eo_sel, and pcs_oe_sel).

Figure 6F:
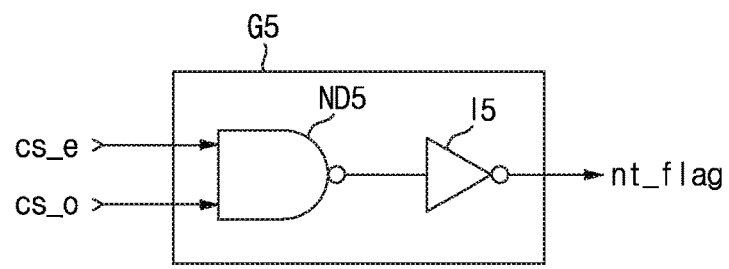

FIG. 6F is a diagram illustrating a configuration of the non-target flag signal generator 66 according to an exemplary embodiment of the inventive concept. The non-target flag signal generator 66 includes a fifth logic gate G5. The fifth logic gate G5 includes a NAND gate ND5 and an inverter I5.

Referring to FIG. 6F, the NAND gate ND5 and the inverter I5 generate the non-target flag signal nt_flag having the "high" level when the first chip selection signal cs_e and the second chip selection signal cs_o have the "high" levels.

The configurations shown in FIGS. 6A to 6F may exactly operate even when the second clock signal ck180 has an earlier phase than the first clock signal ck0 due to the uncertainty of the operation of the frequency divider 56. However, when the frequency divider 56 shown in FIG. 5 exactly operates so that the first clock signal ck0 has an earlier phase than the second clock signal ck180, the command and address generator 22 does not include the sixth flip-flop FF6 shown in FIG. 6B, the second and third logic gates G2 and G3 shown in FIG. 6D, and the switches SW2 and SW3 shown in FIG. 6E.

Figure 7A:
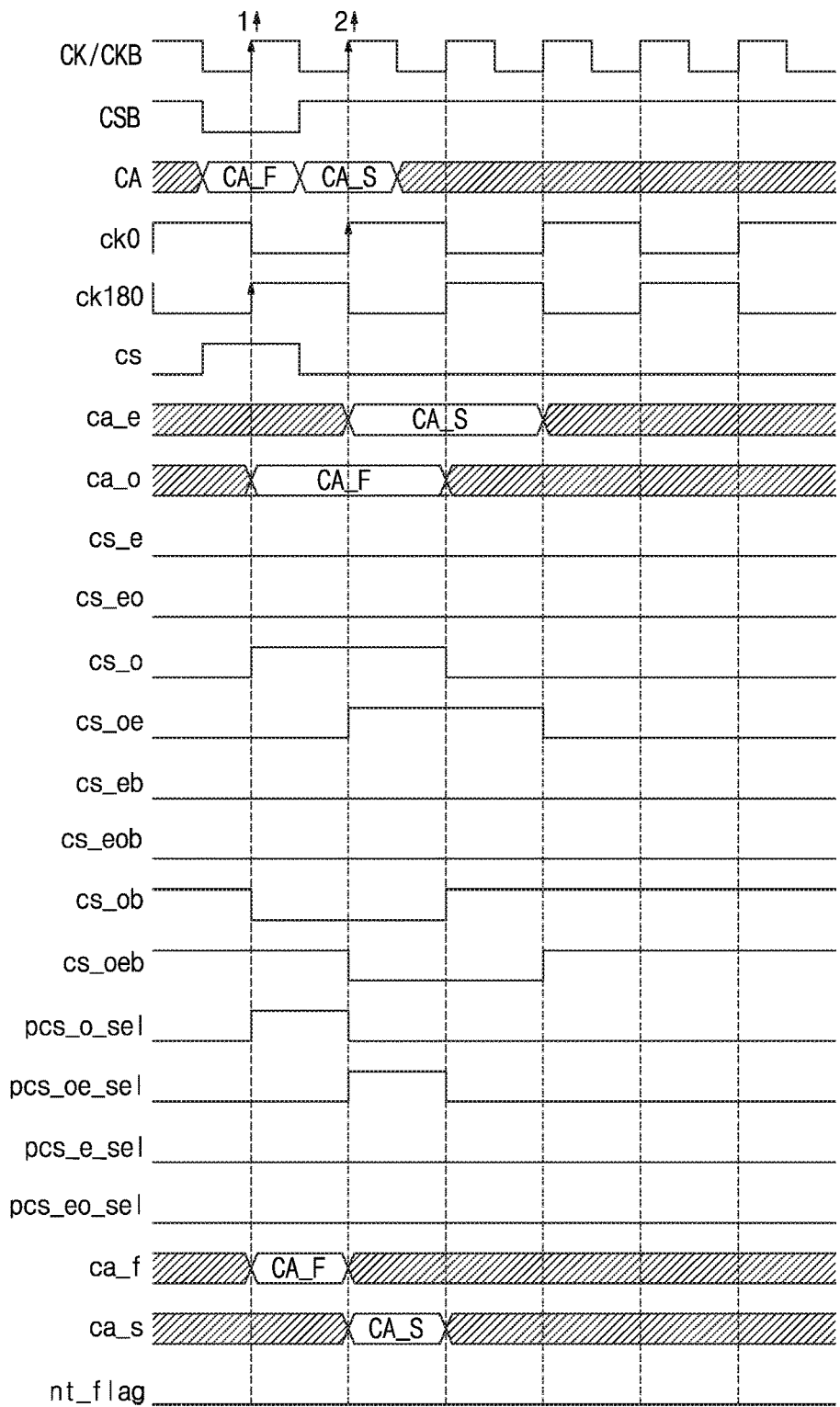
FIGS. 7A, 7B, 8A, and 8B are timing diagrams for describing operations of the command and address generator in a first mode 1 according to an exemplary embodiment of the inventive concept.
Figure 7B:
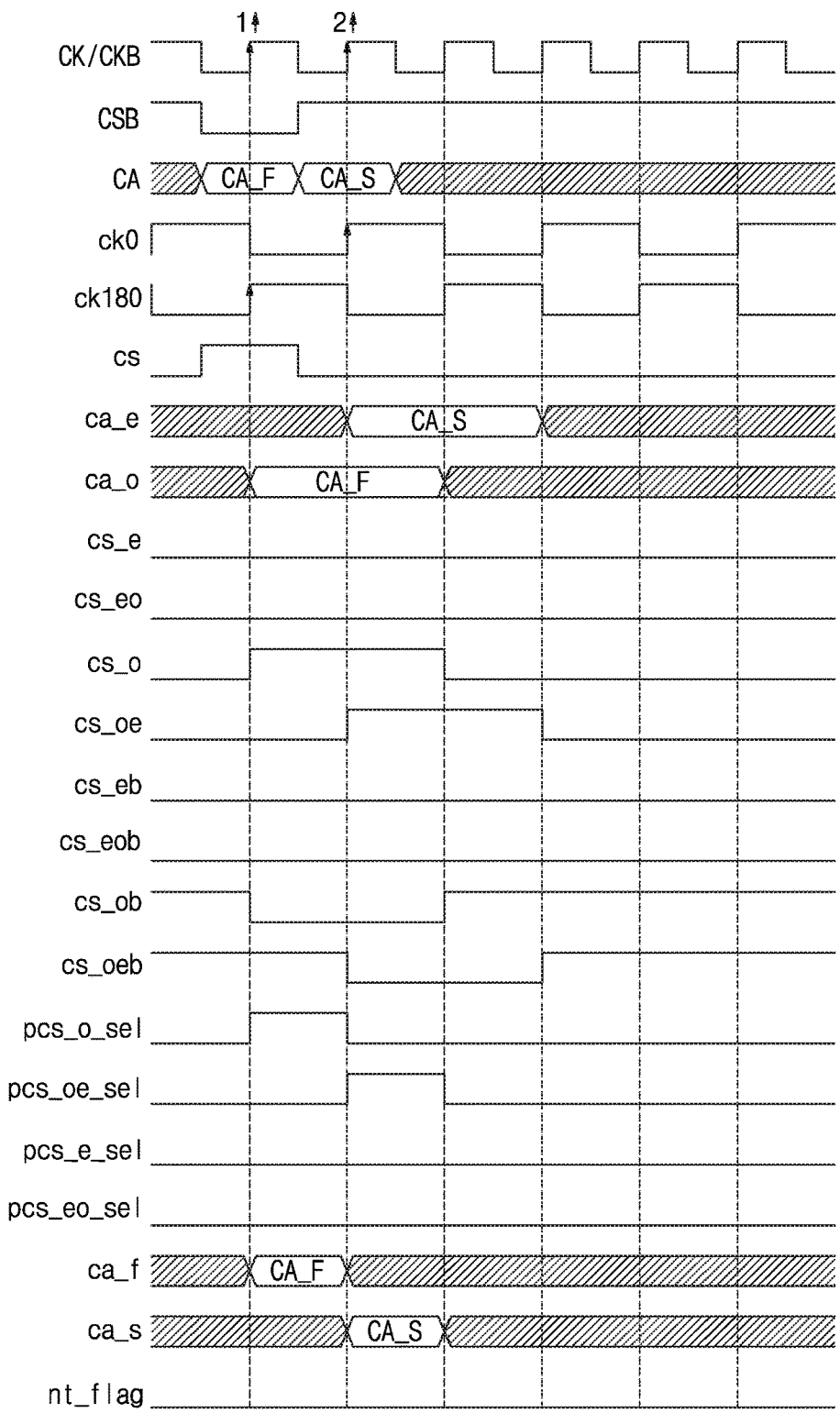

FIGS. 7A and 7B are timing diagrams for describing operations of the command and address generator when the write command or the read command is applied in the first mode 1 M1 according to exemplary embodiments of the inventive concept. FIG. 7A is a timing diagram for describing an operation when a rising edge of the second clock signal ck180 output from the frequency divider 56 is earlier than that of the first clock signal ck0, and FIG. 7B is a timing diagram for describing an operation when the rising edge of the first clock signal ck0 is earlier than that of the second clock signal ck180.

Referring to FIGS. 5, 6A to 6F, and 7A, the inverted chip selection signal buffer 52 inverts and buffers the inverted chip selection signal CSB having the "low" level to generate the buffered chip selection signal cs having the "high" level. The eighth flip-flop FF8 may latch the command and address CA_F at the rising edge of the second clock signal ck180 to generate the second command and address ca_o. The seventh flip-flop FF7 may latch the command and address CA_S at the rising edge of the first clock signal ck0 to generate the first command and address ca_e. The fourth flip-flop FF4 may latch the buffered chip selection signal cs having the "high" level at the rising edge of the second clock signal ck180 to generate the second chip selection signal cs_o having the "high" level. The sixth flip-flop FF6 may latch the second chip selection signal cs_o having the "high" level at the rising edge of the first clock signal ck0 to generate the fourth chip selection signal cs_oe having the "high" level. The third and fifth flip-flops FF3 and FF5 may generate the first chip selection signal cs_e and the third chip selection signal cs_eo having the "low" levels, respectively. The third logic gate G3 performs a logical-AND operation on the second clock signal ck180, the second chip selection signal cs_o, and the first inverted chip selection signal cs_eb having the "high" levels to generate the second selection signal pcs_o_sel having the "high" level. The second logic gate G2 performs a logical-AND operation on the first clock signal ck0, the third inverted chip selection signal cs_eob, and the fourth chip selection signal cs_oe having the "high" levels to generate the fourth selection signal pcs_oe_sel having the "high" level. The switch SW2 may be turned on in response to the second selection signal pcs_o_sel having the "high" level and may output the second command and address ca_o as the first internal command and address ca_f. The switch SW3 may be turned on in response to the fourth selection signal pcs_oe_sel having the "high" level and may output the first command and address ca_e as the second internal command and address ca_s. The fifth logic gate G5 performs a logical-AND operation on the first chip selection signal cs_e having the "low" level and the second chip selection signal cs_o having the "high" level to generate the non-target flag signal nt_flag having the "low" level.

Referring to FIGS. 5, 6A to 6F, and 7B, unlike FIG. 7A, the seventh flip-flop FF7 generates the command and address CA_F as the first command and address ca_e, and the eighth flip-flop FF8 generates the command and address CA_S as the second command and address ca_o. The third flip-flop FF3 may generate the first chip selection signal cs_e having the "high" level. The fifth flip-flop FF5 may generate the third chip selection signal cs_eo having the "high" level. The fourth and sixth flip-flops FF4 and FF6 may generate the second chip selection signal cs_o and the fourth chip selection signal cs_oe having the "low" levels, respectively. The first logic gate G1 performs a logical-AND operation on the first clock ck0, the first chip selection signal cs_e, and the second inverted chip selection signal cs_ob having the "high" levels to generate the first selection signal pcs_e_sel having the "high" level. The fourth logic gate G4 performs a logical-AND operation on the second clock signal ck180, the fourth inverted chip selection signal cs_oeb, and the third chip selection signal cs_eo having the "high" levels to generate the third selection signal pcs_eo_sel having the "high" level. The switch SW1 may be turned on in response to the first selection signal pcs_e_sel having the "high" level and may output the first command and address ca_e as the first internal command and address ca_f. The switch SW4 may be turned on in response to the third selection signal pcs_eo_sel having the "high" level and may output the second command and address ca_o as the second internal command and address ca_s. The fifth logic gate G5 performs a logical-AND operation on the first chip selection signal cs_e having the "low" level and the second chip selection signal cs_o having the "high" level to generate the non-target flag signal nt_flag having the "low" level.

Figure 8A:
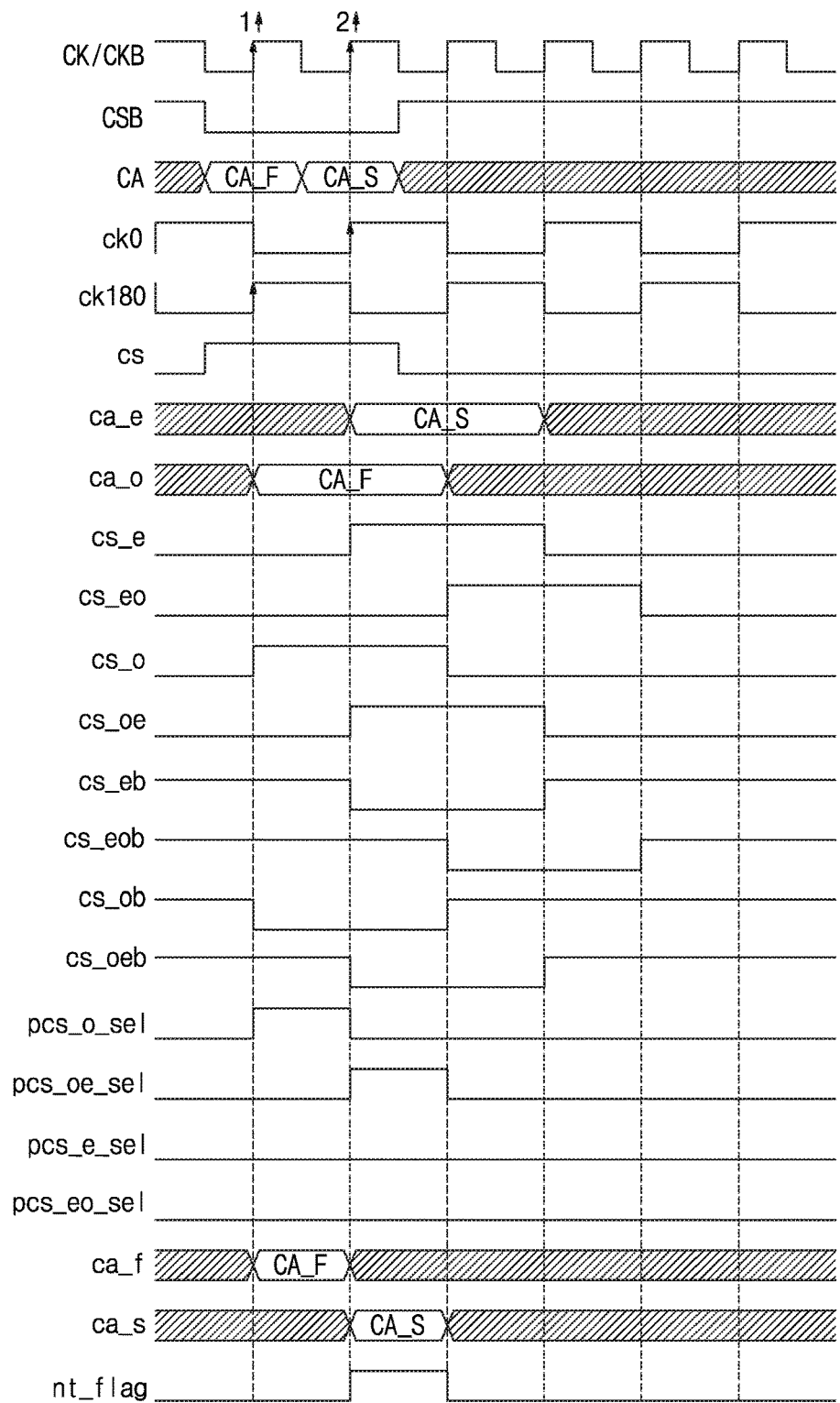
Figure 8B:
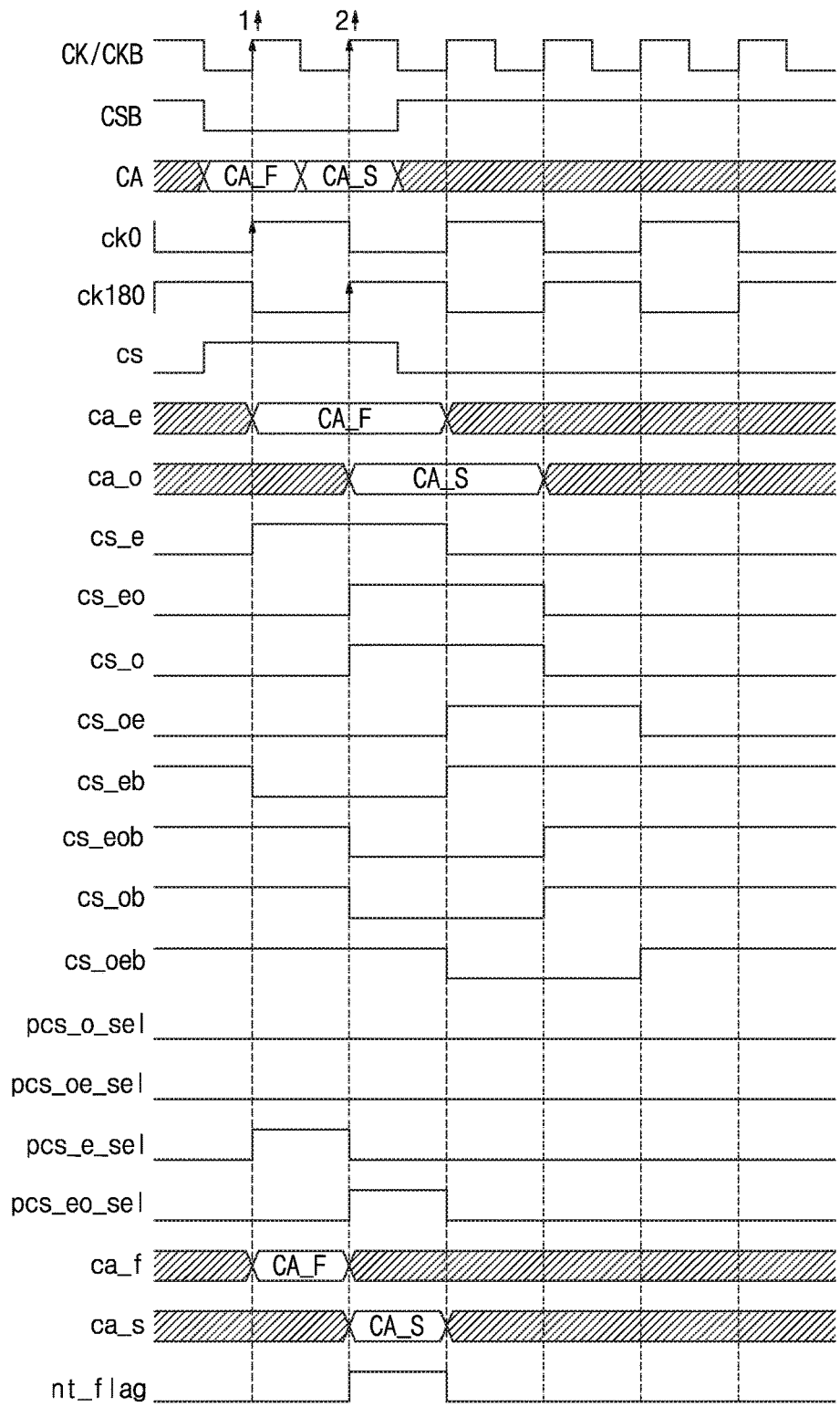

FIGS. 8A and 8B are timing diagrams for describing operations of the command and address generator when the non-target write command or the non-target read command is applied in the first mode 1 M1 according to exemplary embodiments of the inventive concept. FIG. 8A is a timing diagram for describing an operation when the rising edge of the second clock signal ck180 output from the frequency divider 56 is earlier than that of the first clock signal ck0. FIG. 8B is a timing diagram for describing an operation when the rising edge of the first clock signal ck0 output from the frequency divider 56 is earlier than that of the second clock signal ck180.

Referring to FIGS. 5, 6A to 6F, and 8A, unlike FIG. 7A, since the inverted chip selection signal CSB having the "low" level is applied at a second rising edge of the clock signal CK, the third flip-flop FF3 latches the buffered chip selection signal cs having the "high" level at the rising edge of the first clock signal ck0, and generates the first chip selection signal cs_e having the "high" level. The fifth flip-flop FF5 latches the first chip selection signal cs_e having the "high" level at the rising edge of the second clock signal ck180 to generate the third chip selection signal cs_eo having the "high" level. The fifth logic gate G5 combines the first chip selection signal cs_e having the "high" level and the second chip selection signal cs_o having the "high" level to generate the non-target flag signal nt_flag having the "high" level.

Referring to FIGS. 5, 6A to 6F, and 8B, unlike FIG. 7B, since the inverted chip selection signal CSB having the "low" level is applied at the second rising edge of the clock signal CK, the fourth flip-flop FF4 generates the second chip selection signal cs_o having the "high" level at the rising edge of the second clock signal ck180. The sixth flip-flop FF6 latches the second chip selection signal cs_o having the "high" level at the rising edge of the first clock signal ck0 to generate the fourth chip selection signal cs_oe having the "high" level. The fifth logic gate G5 combines the first chip selection signal cs_e having the "high" level and the second chip selection signal cs_o having the "high" level to generate the non-target flag signal nt_flag having the "high" level.

Figure 9:
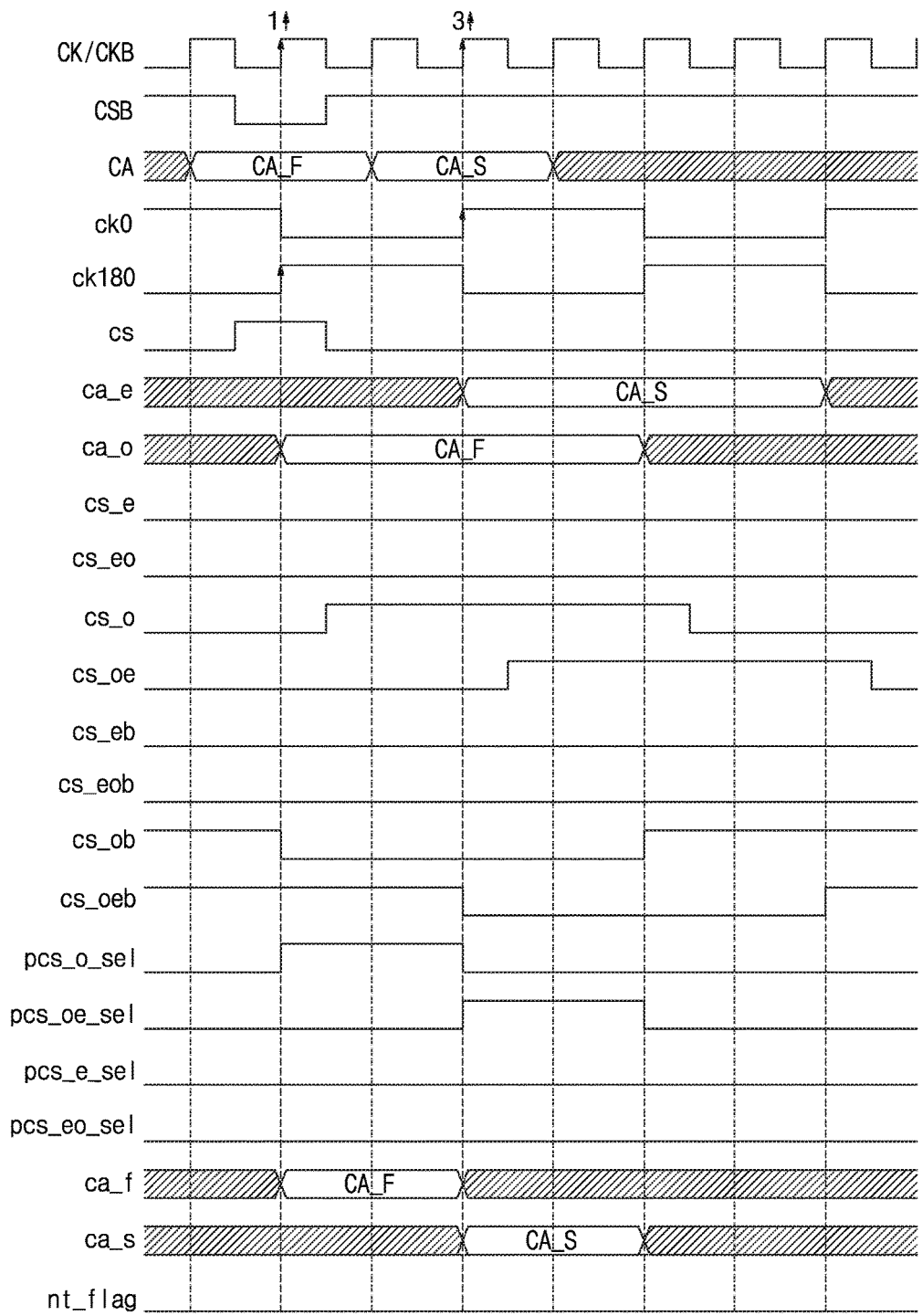
FIGS. 9 and 10 are timing diagrams for describing operations of the command and address generator in a second mode 2 according to an exemplary embodiment of the inventive concept.

FIG. 9 is a timing diagram for describing an operation of the command and address generator 22 when the write command or the read command is applied in the second mode 2 M2 according to exemplary embodiments of the inventive concept. FIG. 9 illustrates an operation when the rising edge of the second clock signal ck180 output from the frequency divider 56 is earlier than that of the first clock signal ck0.

Referring to FIG. 9, when the mode signal MODE is set to the second mode 2 M2, the command and address CA_F and the command and address CA_S are sequentially input to be aligned at the first rising edge and the third rising edge of the clock signal CK during four clock cycles. Referring to FIGS. 7A and 9, in the first mode 1 M1 and the second mode 2 M2, the inverted chip selection signal CSB is input to be aligned at the first rising edge of the clock signal CK during one clock cycle. Referring to FIGS. 7A and 9, the clock cycle of each of remaining signals except the chip selection signal cs generated in the second mode 2 M2 is double compared with the clock cycle of each of remaining signals generated in first mode 1 M1.

Although not shown, like the timing diagram shown in FIG. 7B, the first clock signal ck0 may have an earlier phase than the second clock signal ck180. In this case, unlike the signals shown in the timing diagram shown in FIG. 7B, the clock cycle of each of the remaining signals except the chip selection signal cs generated in second mode 2 M2 are double compared with the clock cycle of each of the remaining signals generated in mode 1 M1.

Figure 10:
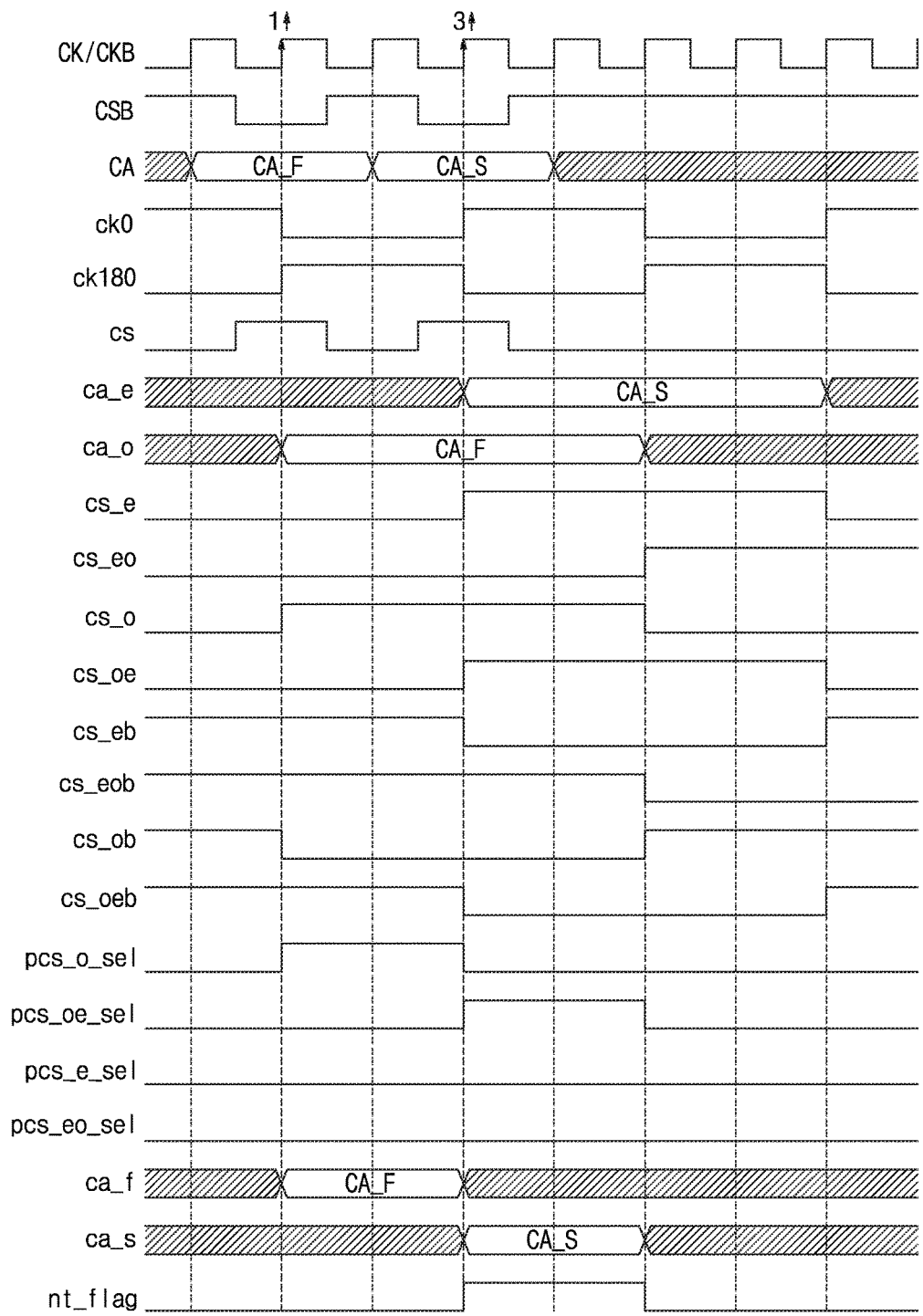

FIG. 10 is a timing diagram for describing an operation of the command and address generator 22 when the non-target write command or the non-target read command is applied in second mode 2 M2 according to exemplary embodiments of the inventive concept. FIG. 10 illustrates an operation when the rising edge of the second clock signal ck180 output from the frequency divider 56 is earlier than that of the first clock signal ck0.

Referring to FIG. 10, when the mode signal MODE is set to the second mode 2 M2, the command and address CA_F and the command and address CA_S are sequentially input to be aligned at the first rising edge and the third rising edge of the clock signal CK during two clock cycles. Referring to FIGS. 8A and 10, in the first mode 1 M1 and the second mode 2 M2, the inverted chip selection signal CSB is input to be aligned at each of the first rising edge and the third rising edge of the clock signal CK during one clock cycle. Referring to FIGS. 8A and 10, the clock cycle of each of remaining signals except the chip selection signal cs generated in second mode 2 M2 are double compared with the clock cycle of each of remaining signals generated in mode 1 M1.

Although not shown, like the timing diagram shown in FIG. 8B, the first clock signal ck0 may have an earlier phase than the second clock signal ck180. In this case, unlike the signals shown in the timing diagram of FIG. 8B, the clock cycle of each of the remaining signals except the chip selection signal cs generated in the second mode 2 M2 are double compared with the clock cycle of each of the remaining signals generated in mode 1 M1.

When the mode signal MODE is set to first mode 1 M1, since the command and address generator 22 according to an exemplary embodiment of the inventive concept generates the commands, the row address, and the column address in response to the clock signal generated by dividing the frequency of the clock signal CK by 2, power consumption of the semiconductor memory device 200 may be decreased. Further, when the mode signal MODE is set to the second mode 2 M2, since the command and address generator 22 according to an exemplary embodiment of the inventive concept generates the commands, the row address, and the column address in response to the clock signal generated by dividing the frequency of the clock signal CK by 4, power consumption of the semiconductor memory device 200 may be further decreased compared with the case in first mode 1 M1.

Figure 11:
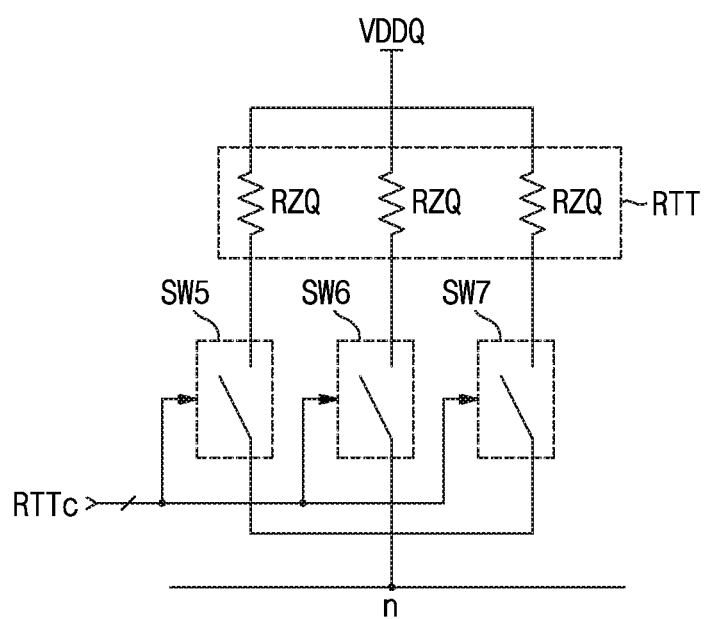
FIG. 11 is a diagram illustrating a configuration of a data termination unit and a data strobe signal termination unit according to an exemplary embodiment of the inventive concept.

FIG. 11 is a diagram illustrating a configuration of the DQ termination unit 44-1 and the DQS termination unit 44-2 according to an exemplary embodiment of the inventive concept. Each of the termination units 44-1 and 44-2 may include an on-die termination resistor RTT including resistors RZQ, and switches SW5 to SW7. FIG. 11 illustrates an example in which the value of the on-die termination resistor RTT of each of the termination units 44-1 and 44-2 is changed by a total 3-bit variable resistance code RTTc.

The resistors RZQ are connected or not connected to a node n since the switches SW5 to SW7 are turned on or off in response to the variable resistance code RTTc. For example, when the 3-bit variable resistance code RTTc are "high" levels, the switches SW5 to SW7 are turned on, and the value of the on-die termination resistor RTT connected to the node n is RZQ/3.

According to exemplary embodiments of the inventive concept, the semiconductor memory device and the memory system may reduce power consumption since the commands and the address signals are generated using the divided clock signal generated by dividing the clock signal applied from an outside source.

According to exemplary embodiments of the inventive concept, the semiconductor memory device may receive the command and address, generate the commands, and perform the on-die termination function.

According to exemplary embodiments of the inventive concept, the semiconductor memory device may exactly generate the commands and the address signals even when the phases of the divided clock signals are changed due to the uncertainty of the operation of the frequency divider.

While the present inventive concept has been particularly shown and described with reference to the exemplary embodiments thereof, it will be understood by those of ordinary skill in the art that various changes in form and detail may be made therein without departing from the spirit and scope of the present inventive concept.

What is claimed is:
1. A semiconductor memory device, comprising:
a first buffer configured to buffer a clock signal to generate a buffered clock signal;
a second buffer configured to invert and buffer an inverted chip selection signal to generate a buffered chip selection signal;
a third buffer configured to buffer a command and address to generate a buffered command and address;

a frequency divider configured to divide a frequency of the buffered clock signal to generate a first clock signal and a second clock signal having phases inverted from each other;

a first sampler configured to output the buffered chip selection signal as a first chip selection signal in response to the first clock signal, output the buffered chip selection signal as a second chip selection signal in response to the second clock signal, and output the first chip selection signal as a third chip selection signal in response to the second clock signal;

a second sampler configured to output the buffered command and address as a first command and address in response to the first clock signal, and output the buffered command and address as a second command and address in response to the second clock signal;

a signal detector configured to output the first chip selection signal as a first selection signal in response to the first clock signal, and output the third chip selection signal as a second selection signal in response to the second clock signal;

a control circuit configured to output the first command and address as a first internal command and address in response to the first selection signal, and output the second command and address as a second internal command and address in response to the second selection signal;

a flag signal generator configured to generate a flag signal using the first chip selection signal and the second chip selection signal; and a command decoder and address generator configured to decode a command signal included in the first internal command and address and the second internal command and address in response to the flag signal to generate a target command or a non-target command.

2. The semiconductor memory device of claim 1, wherein the frequency divider comprises:
a first flip-flop configured to divide a frequency of the buffered clock signal by 2 to generate a first divided clock signal and an inverted first divided clock signal;
a second flip-flop configured to divide a frequency of the first divided clock signal by 2 to generate a second divided clock signal and an inverted second divided clock signal; and
a selector configured to output the first divided clock signal as the first clock signal and output the inverted first divided clock signal as the second clock signal when a mode signal is a first value, and output the second divided clock signal as the first clock signal and output the inverted second divided clock signal as the second clock signal when the mode signal is a second value.

3. The semiconductor memory device of claim 1, wherein the first sampler comprises:
a first flip-flop configured to output the buffered chip selection signal as the first chip selection signal in response to the first clock signal;
a second flip-flop configured to output the buffered chip selection signal as the second chip selection signal in response to the second clock signal; and
a third flip-flop configured to output the first chip selection signal as the third chip selection signal in response to the second clock signal.

4. The semiconductor memory device of claim 1, wherein the second sampler comprises:

a first flip-flop configured to generate the buffered command and address as the first command and address in response to the first clock signal; and
a second flip-flop configured to output the buffered command and address as the second command and address in response to the second clock signal.

5. The semiconductor memory device of claim 1, wherein the signal detector comprises:
a first logic gate configured to output the first chip selection signal as the first selection signal in response to the first clock signal; and
a second logic gate configured to output the third chip selection signal as the third selection signal in response to the second clock signal.

6. The semiconductor memory device of claim 1, wherein the control circuit comprises:
a first switch configured to output the first command and address as the first internal command and address in response to the first selection signal; and
a second switch configured to output the second command and address as the second internal command and address in response to the third selection signal.

7. The semiconductor memory device of claim 2, wherein the first sampler outputs the second chip selection signal as a fourth chip selection signal in response to the first clock signal,
the signal detector outputs the second chip selection signal as a third selection signal in response to the second clock signal, and outputs the fourth chip selection signal as a fourth selection signal in response to the first clock signal, and
the control circuit generates the second command and address as the first internal command and address in response to the third selection signal, and generates the first command and address as the second internal command and address in response to the fourth selection signal.

8. The semiconductor memory device of claim 7, wherein the first sampler comprises:
a third flip-flop configured to output the buffered chip selection signal as the first chip selection signal in response to the first clock signal;
a fourth flip-flop configured to output the buffered chip selection signal as the second chip selection signal in response to the second clock signal;
a fifth flip-flop configured to output the first chip selection signal as the third chip selection signal in response to the second clock signal; and
a sixth flip-flop configured to output the second chip selection signal as the fourth chip selection signal in response to the first clock signal.

9. The semiconductor memory device of claim 7, wherein the second sampler comprises:
a third flip-flop configured to output the buffered command and address as the first command and address in response to the first clock signal; and
a fourth flip-flop configured to output the buffered command and address as the second command and address in response to the second clock signal.

10. The semiconductor memory device of claim 7, wherein the signal detector comprises:
a first logic gate configured to output the first chip selection signal as the first selection signal in response to the first clock signal;
a second logic gate configured to output the fourth chip selection signal as the fourth selection signal in response to the first clock signal;

a third logic gate configured to output the second chip selection signal as the third selection signal in response to the second clock signal; and a fourth logic gate configured to output the third chip selection signal as the second selection signal in response to the second clock signal.

11. The semiconductor memory device of claim 7, wherein the control circuit comprises:
   a first switch configured to output the first command and address as the first internal command and address in response to the first selection signal;
   a second switch configured to output the second command and address as the first internal command and address in response to the third selection signal;
   a third switch configured to output the first command and address as the second internal command and address in response to the fourth selection signal; and
   a fourth switch configured to output the second command and address as the second internal command and address in response to the second selection signal.

12. The semiconductor memory device of claim 7, wherein the flag signal generator comprises a logic gate configured to combine the first chip selection signal and the second chip selection signal to generate the flag signal.

13. The semiconductor memory device of claim 1, wherein the target command comprises one of a write command and a read command, and the non-target command comprises one of a non-target write command and a non-target read command,
   the semiconductor memory device further comprises:
   data terminals configured to input and output data; and
   data strobe signal terminals configured to input and output data strobe signals, and
   the semiconductor memory device controls an on-die termination resistor for each of the data terminals and the data strobe signal terminals in response to the target command and the non-target command.

14. The semiconductor memory device of claim 2, wherein the target command comprises one of a write command and a read command, and the non-target command comprises one of a non-target write command and a non-target read command,
   the command decoder and address generator decodes a command signal included in the first internal command and address and the second internal command and address to generate a mode setting command, and generates a mode setting command using an address signal included in the first internal command and address and the second internal command, and
   the semiconductor memory device further comprises:
   data terminals configured to input and output data;
   data strobe signal terminals configured to input and output a data strobe signal;
   a mode setting register configured to input the mode setting code in response to the mode setting command, and store the mode signal and values of an on-die termination code, an on-die termination on write latency, an on-die termination off write latency, an on-die termination on read latency, and an on-die termination off read latency;
   a latency control signal generator configured to generate an on-die termination latency control signal using the values of the on-die termination on write latency and the on-die termination off write latency when the write command or the non-target write command is generated, and generate the on-die termination latency control signal using the values of the on-die termination on read latency and the on-die termination off read latency when the read command or the non-target read command is generated;
   an on-die termination controller configured to generate the on-die termination code corresponding to the write command, the non-target write command, the read command, or the non-target read command as a variable resistance code in response to the on-die termination latency control signal; and
   a termination circuit configured to vary a value of an on-die termination resistor in response to the variable resistance code.

15. The semiconductor memory device of claim 14, wherein the termination circuit comprises:
   a plurality of resistors connected between a predetermined voltage and each of a plurality of nodes; and
   a plurality of switches connected between each of the plurality of nodes and each of the data terminals and the data strobe signal terminals, and turned on or off in response to the variable resistance code.

16. A semiconductor memory device, comprising:
   a frequency divider configured to divide a frequency of a clock signal to generate a first clock signal and a second clock signal having phases inverted from each other;
   a first sampler configured to sample a chip selection signal in response to the first clock signal and the second clock signal, generate a first chip selection signal and a second chip selection signal, and output the first chip selection signal as a third chip selection signal in response to the second clock signal;
   a second sampler configured to sample a command and address in response to the first clock signal and the second clock signal to generate a first command and address and a second command and address;
   a signal detector configured to output the first chip selection signal as a first selection signal in response to the first clock signal, and output the third chip selection signal as a second selection signal in response to the second clock signal;
   a control circuit configured to output the first command and address and the second command and address as a first internal command and address and a second internal command and address in response to the first selection signal and the second selection signal; and
   a flag signal generator configured to generate a flag signal using the first chip selection signal and the second chip selection signal.

17. The semiconductor memory device of claim 16, wherein the frequency divider comprises:
   a first flip-flop configured to divide a frequency of the buffered clock signal by 2 to generate a first divided clock signal and an inverted first divided clock signal;
   a second flip-flop configured to divide a frequency of the first divided clock signal by 2 to generate a second divided clock signal and an inverted second divided clock signal; and
   a selector configured to output the first divided clock signal as the first clock signal and output the inverted first divided clock signal as the second clock signal when a mode signal is a first value, output the second divided clock signal as the first clock signal and the inverted second divided clock signal as the second clock signal when the mode signal is a second value.

18. The semiconductor memory device of claim 17, wherein the first sampler further generates the buffered chip selection signal as a fourth chip selection signal in response to the first clock signal, the signal detector generates the second chip selection signal and the fourth chip selection signal as a third selection signal and a fourth selection signal in response to the second clock signal and the first clock signal, the control circuit generates the second command and address and the first command and address as the first internal command and address and the second internal command and address in response to the third selection signal and the fourth selection signal, and the semiconductor memory device decodes a command signal included in the first internal command and address and the second internal command and address in response to the flag signal to generate a target command or a non-target command.

19. A memory system, comprising:

a controller;

a first rank including a plurality of first semiconductor memory devices;

a second rank including a plurality of second semiconductor memory devices;

a first inverted chip selection signal line connected between the controller and the first rank, and configured to transmit a first inverted chip selection signal;

a second inverted chip selection signal line connected between the controller and the second rank, and configured to transmit a second inverted chip selection signal;

a clock signal line shared by the controller, the first rank, and the second rank, and configured to transmit a clock signal;

command and address lines shared by the controller, the first rank, and the second rank, and configured to transmit a command and address; and data lines shared by the controller, the first rank, and the second rank, and configured to transceive data, wherein the controller applies the command and address together with the first inverted chip selection signal and the second inverted chip selection signal having deactivation states at a first rising edge of the clock signal, and applies the command and address together with the first inverted chip selection signal having an activation state and the second inverted chip selection signal having a deactivation state at a second or third rising edge of the clock signal according to a mode signal, and each of the semiconductor memory devices includes a command and address generator which generates divided first and second clock signals by dividing a frequency of the clock signal according to the mode signal, when the first clock signal has an earlier phase than the second clock signal, outputs the first inverted chip selection signal as a first chip selection signal in response to the first clock signal, outputs the second inverted chip selection signal as a second chip selection signal in response to the second clock signal, outputs the first chip selection signal as a third chip selection signal in response to the second clock signal, outputs the command and address as a first command and address in response to the first clock signal, outputs the command and address as a second command and address in response to the second clock signal, outputs the first chip selection signal as a first selection signal in response to the first clock signal, outputs the third chip selection signal as a second selection signal in response to the second clock signal, outputs the first command and address as a first internal command and address in response to the first selection signal, outputs the second command and address as a second internal command and address in response to the second selection signal, generates a flag signal using the first chip selection signal and the second chip selection signal, and decodes a command signal included in the first internal command and address and the second internal command and address in response to the flag signal to generate a target command or a non-target command, and each of the semiconductor memory devices controls an on-die termination resistor in response to the target command and the non-target command.

20. The memory system of claim 19, wherein the command and address generator of each of the semiconductor memory devices, when the second clock signal has an earlier phase than the first clock signal, outputs the second chip selection signal as a fourth chip selection signal in response to the first clock signal, outputs the second chip selection signal as a third selection signal in response to the second clock signal, outputs the fourth chip selection signal as a fourth selection signal in response to the first clock signal, outputs the second command and address as the first internal command and address in response to the third selection signal, and outputs the first command and address as the second internal command and address in response to the fourth selection signal.

* * * * *